United States Patent
Kim et al.

(10) Patent No.: US 10,720,470 B2
(45) Date of Patent: Jul. 21, 2020

(54) VARIABLE RESISTANCE MEMORY DEVICES

(71) Applicant: Samsung Electronics Co., Ltd., Suwon-si, Gyeonggi-do (KR)

(72) Inventors: Byongju Kim, Hwaseong-si (KR); Young-min Ko, Hwaseong-si (KR); Jong-uk Kim, Yongin-si (KR); Kwangmin Park, Seoul (KR); Jeong-hee Park, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 16/277,385

(22) Filed: Feb. 15, 2019

(65) Prior Publication Data

US 2020/0052038 A1    Feb. 13, 2020

(30) Foreign Application Priority Data

Aug. 10, 2018    (KR) .......................... 10-2018-0093995

(51) Int. Cl.
| | |
|---|---|
| *H01L 27/24* | (2006.01) |
| *H01L 45/00* | (2006.01) |
| *H01F 10/32* | (2006.01) |
| *H01L 43/02* | (2006.01) |
| *H01L 43/12* | (2006.01) |
| *H01L 27/22* | (2006.01) |
| *H01L 43/10* | (2006.01) |

(52) U.S. Cl.
CPC ...... *H01L 27/2481* (2013.01); *H01L 27/2427* (2013.01); *H01L 45/06* (2013.01); *H01L 45/08* (2013.01); *H01L 45/126* (2013.01); *H01L 45/1233* (2013.01); *H01L 45/16* (2013.01); *H01F 10/329* (2013.01); *H01F 10/3254* (2013.01); *H01L 27/224* (2013.01); *H01L 43/02* (2013.01); *H01L 43/10* (2013.01); *H01L 43/12* (2013.01); *H01L 45/144* (2013.01); *H01L 45/146* (2013.01)

(58) Field of Classification Search
CPC ............. H01L 27/2481; H01L 27/2427; H01L 45/1233; H01L 45/126
See application file for complete search history.

(56) References Cited

U.S. PATENT DOCUMENTS

| | | |
|---|---|---|
| 9,029,828 B2 | 5/2015 | Oh |
| 2009/0196091 A1 | 8/2009 | Kau |
| | (Continued) | |

*Primary Examiner* — Allison Bernstein
(74) *Attorney, Agent, or Firm* — Myers Bigel, P.A.

(57) ABSTRACT

There is provided a variable resistance memory device including a first electrode line layer including first electrode lines extending in a first direction and spaced apart from each other on a substrate, a second electrode line layer that is above the first electrode line layer and including second electrode lines extending in a second direction orthogonal to the first direction and spaced apart from each other, and a memory cell layer including memory cells between the first electrode line layer and the second electrode line layer. Each of the memory cells includes a selection device layer, an intermediate electrode layer, and a variable resistance layer. A first insulating layer is between the first electrode lines, a second insulating layer is between the memory cells, and a third insulating layer is between the second electrode lines. The second insulating layer includes air gaps on side surfaces of the memory cells.

19 Claims, 24 Drawing Sheets

(56) References Cited

U.S. PATENT DOCUMENTS

2014/0166965 A1   6/2014  Seo
2017/0244031 A1*  8/2017  Jeong ...................... H01L 45/04
2017/0250339 A1*  8/2017  Sim ..................... H01L 45/1233
2018/0277758 A1   9/2018  Park

* cited by examiner

4X – 4X'

VARIABLE RESISTANCE MEMORY DEVICES

CROSS-REFERENCE TO RELATED APPLICATION

This U.S. non-provisional patent application claims priority under 35 U.S.C. § 119 to Korean Patent Application No. 10-2018-0093995, filed on Aug. 10, 2018, in the Korean Intellectual Property Office, the entire content of which is incorporated herein by reference.

BACKGROUND

The inventive concepts relate to variable resistance memory devices, and more particularly, to variable resistance memory devices having a three-dimensional intersecting point stacking structure.

A variable resistance memory device including a selection device using a chalcogenide material has been developed. When a voltage is applied to the selection device using the chalcogenide material, which is commonly in an amorphous state, an electronic structure changes so that an electrical characteristic thereof changes from a nonconductive state to a conductive state. When a voltage is removed from the selection device, the selection device transitions again to being in the nonconductive state. By using such a characteristic, the selection device using the chalcogenide material may be used for the memory device having the three-dimensional intersecting point stacking structure instead of a diode.

SUMMARY

The inventive concepts provide a variable resistance memory device formed such that an insulating layer including air gaps surrounds memory cells to reduce cross-talk.

A problem to be solved by the inventive concepts is not limited thereto and other problems that are not mentioned above may be clearly understood by those of ordinary skill in the art from the following description.

According to an aspect of the inventive concepts, there is provided a variable resistance memory device including a first electrode line layer including first electrode lines extending in a first direction and spaced apart from each other on a substrate, a second electrode line layer that is above the first electrode line layer and including second electrode lines extending in a second direction orthogonal to the first direction and spaced apart from each other, and a memory cell layer including memory cells between the first electrode line layer and the second electrode line layer in locations in which the first electrode lines and the second electrode lines overlap each other. Each of the memory cells includes a selection device layer, an intermediate electrode layer, and a variable resistance layer. A first insulating layer is between the first electrode lines, a second insulating layer is between the memory cells, and a third insulating layer is between the second electrode lines. The second insulating layer includes air gaps on side surfaces of the memory cells, the air gaps intersecting each other in the first direction and the second direction.

According to an aspect of the inventive concepts, there is provided a variable resistance memory device including a first electrode line layer, a second electrode line layer above the first electrode line layer, a first memory cell layer between the first electrode line layer and the second electrode line layer and including first memory cells, and an insulating layer including first air gaps that are on all side surfaces of the first memory cells. Each of the first memory cells includes a selection device layer, an intermediate electrode layer, and a variable resistance layer.

According to an aspect of the inventive concepts, there is provided a variable resistance memory device including a first electrode line layer including first electrode lines extending in a first direction and spaced apart from each other on a substrate, a second electrode line layer above the first electrode line layer and including second electrode lines extending in a second direction orthogonal to the first direction and spaced apart from each other, and a memory cell layer including memory cells between the first electrode line layer and the second electrode line layer in locations in which the first electrode lines and the second electrode lines overlap each other. Each of the memory cells includes a selection device layer, an intermediate electrode layer, and a variable resistance layer. An insulating layer including air gaps is arranged among the memory cells. The memory cells are isolated from each other by the air gaps. In the memory cells, a respective second width of each of the memory cells adjacent to the second electrode line layer is larger than a respective first width of each of the memory cells adjacent to the first electrode line layer.

BRIEF DESCRIPTION OF THE DRAWINGS

Embodiments of the inventive concepts will be more clearly understood from the following detailed description taken in conjunction with the accompanying drawings in which.

DETAILED DESCRIPTION

Hereinafter, an embodiment of the inventive concepts will be described in detail with reference to the accompanying drawings.

Figure 1:
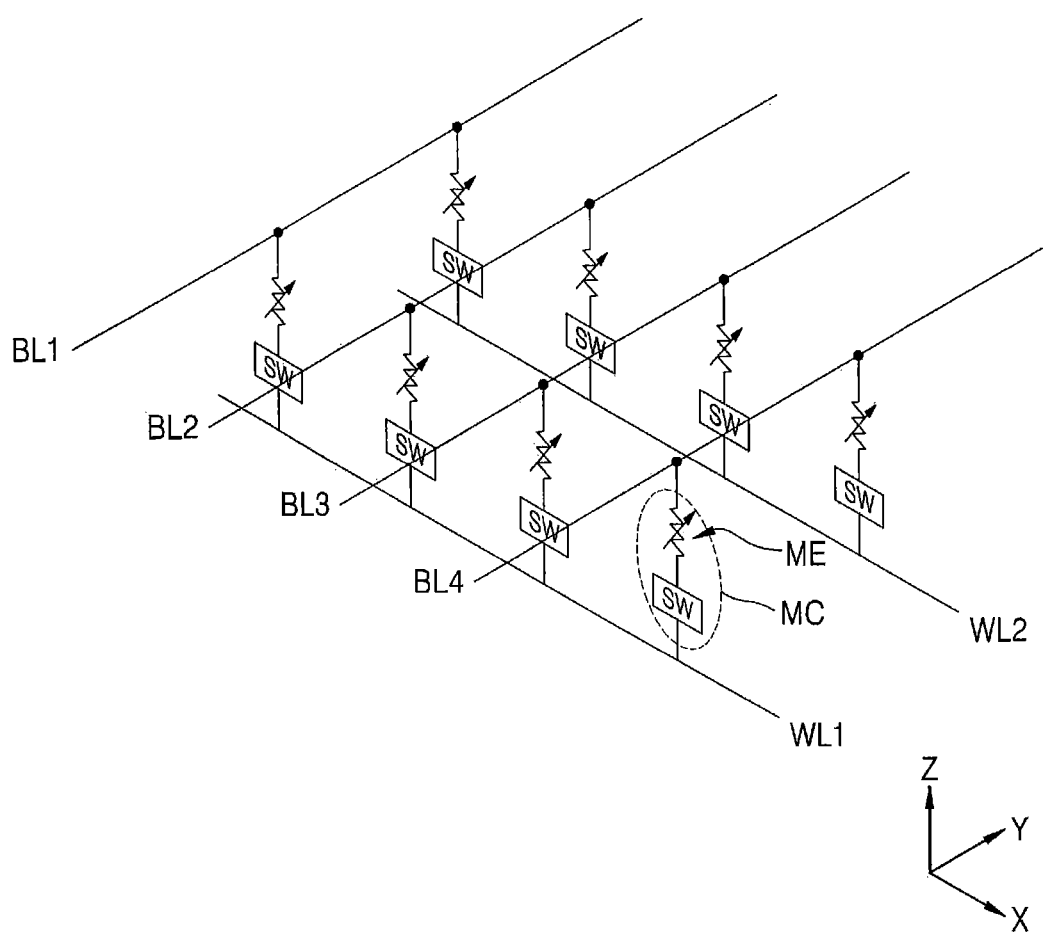
FIG. 1 is an equivalent circuit diagram illustrating a variable resistance memory device according to an embodiment of the inventive concepts.

FIG. 1 is an equivalent circuit diagram illustrating a variable resistance memory device 100 according to an embodiment of the inventive concepts.

Referring to FIG. 1, the variable resistance memory device 100 may include word lines WL1 and WL2 extending in a first direction X and spaced apart from each other in a second direction Y perpendicular to the first direction X. The variable resistance memory device 100 may include bit lines BL1, BL2, BL3, and BL4 spaced apart from the word lines WL1 and WL2 in a third direction Z and extending in the second direction Y.

Memory cells MC may be arranged between the bit lines BL1, BL2, BL3, and BL4 and the word lines WL1 and WL2. In detail, the memory cells MC may be arranged at overlapping points (e.g., intersecting in a plan view) of the bit lines BL1, BL2, BL3, and BL4 and the word lines WL1 and WL2 and may include variable resistance layers ME for storing information and selection device layers SW for selecting the memory cells MC. The selection device layers SW may be referred to as switching device layers or access device layers.

The memory cells MC having the same structure may be arranged in the third direction Z. For example, in the memory cell MC arranged between the word line WL1 and the bit line BL1, the selection device layer SW is electrically connected to the word line WL1, the variable resistance layer. ME is electrically connected to the bit line BL1, and the variable resistance layer ME and the selection device layer SW may be serially connected to each other.

However, the inventive concepts are not limited thereto. For example, in some embodiments, positions of the selection device layers SW and positions of the variable resistance layers ME may be reversed in the memory cells MC. That is, in the memory cells MC, the variable resistance layers ME may be connected to the word line WL1 and the selection device layers SW may be connected to the bit line BL1.

A method of driving the variable resistance memory device 100 will be described. Voltages are applied to the variable resistance layers ME of the memory cells MC through the word lines WL1 and WL2 and the bit lines BL1, BL2, BL3, and BL4 so that currents may flow through the variable resistance layers ME. For example, the variable resistance layers ME may include phase change material layers that may reversibly transition between a first state and a second state. However, the variable resistance layers ME are not limited thereto. Any variable resistance substances of which resistance values vary in accordance with applied voltages may be used without deviating from the inventive concepts. For example, in a selected memory cell MC, resistance of a variable resistance layer ME may reversibly transition between the first state and the second state in accordance with a voltage applied to the variable resistance layer ME.

In accordance with a change in resistance of the variable resistance layer ME, the memory cell MC may store digital information such as '0' or '1' and/or may erase the digital information from the memory cell MC. For example, the memory cell MC may write data in a high resistance state '0' and a low resistance state '1'. Here, writing from the high resistance state '0' to the low resistance state '1' may be referred to as "a set operation" and writing from the low resistance state '1' to the high resistance state '0' may be referred to as "a reset operation." The memory cell MC is not limited only to the digital information in the high resistance state '0' and the low resistance state '1' and may store various resistance states.

An arbitrary memory cell MC may be addressed by selection of one of the word lines WL1 and WL2 and one of the bit lines BL1, BL2, BL3, and BL4 and the memory cell MC may be programmed by applying a predetermined signal between the word lines WL1 and WL2 and the bit lines BL1, BL2, BL3, and BL4. In addition, information that is programmed in accordance with a resistance value of a variable resistance layer ME of the corresponding memory cell MC may be read by measuring a current value through the bit lines BL1, BL2, BL3, and/or BL4.

Figure 2:
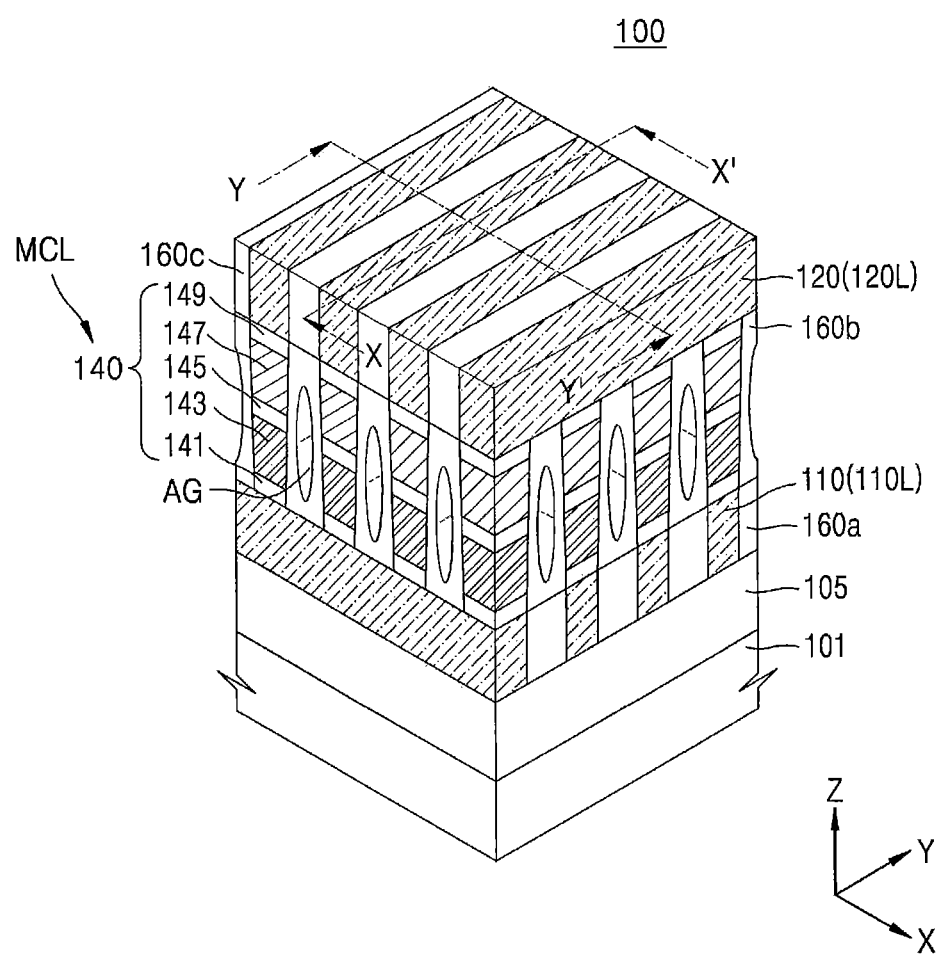
FIG. 2 is a perspective view illustrating a variable resistance memory device according to an embodiment of the inventive concepts.
Figure 3:
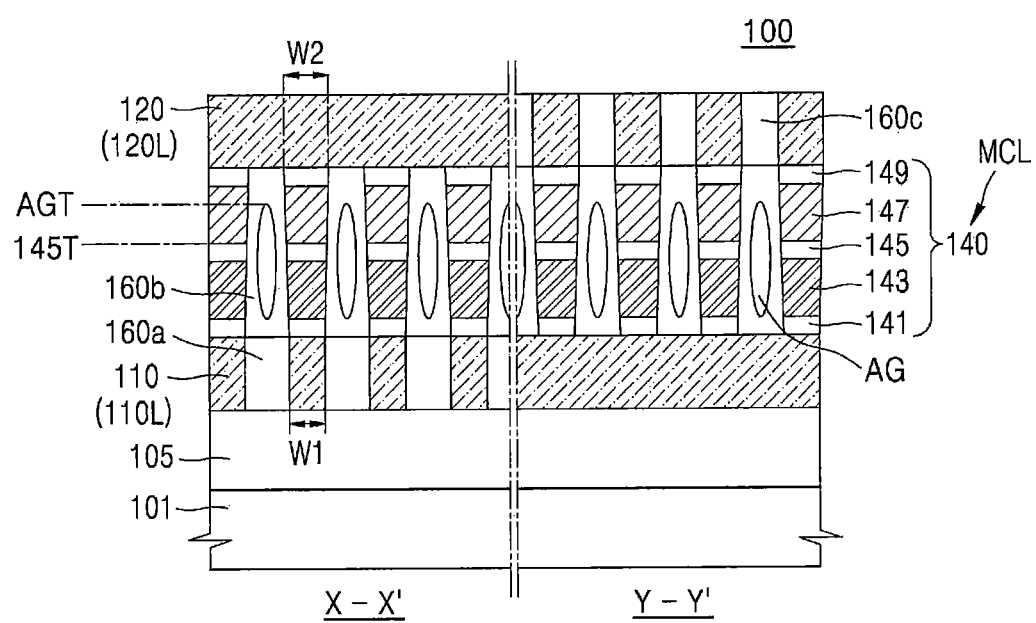
FIG. 3 is a cross-sectional view taken along lines X-X' and Y-Y' of FIG. 2.
Figure 4:
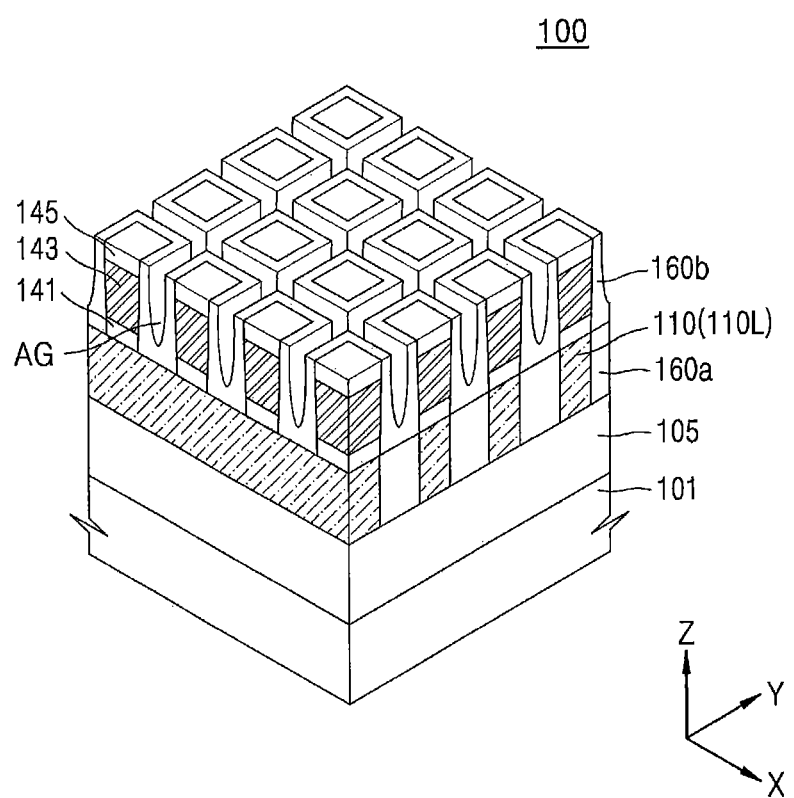
FIG. 4 is a perspective cross-sectional view of FIG. 2 in which air gaps are illustrated.

FIG. 2 is a perspective view illustrating a variable resistance memory device 100 according to an embodiment of the inventive concepts. FIG. 3 is a cross-sectional view taken along lines X-X' and Y-Y' of FIG. 2. FIG. 4 is a perspective cross-sectional of FIG. 2 in which air gaps are illustrated.

Referring to FIGS. 2 to 4, the variable resistance memory device 100 may include a first electrode line layer 110L, a second electrode line layer 120L, and a memory cell layer MCL on a substrate 101.

As illustrated in FIGS. 2 to 4, an interlayer insulating layer 105 may be arranged on the substrate 101. The interlayer insulating layer 105 may be formed of a silicon oxide, a silicon nitride, and/or a silicon oxynitride and may electrically isolate the first electrode line layer 110L from the substrate 101. In the variable resistance memory device 100, the interlayer insulating layer 105 is arranged on the substrate 101, which is only an example. In some embodiments, in the variable resistance memory device 100, an integrated circuit layer may be arranged on the substrate 101 and memory cells may be arranged on the integrated circuit layer. The integrated circuit layer may include, for example, a peripheral circuit for operating the memory cells and/or a core circuit for operations. For reference, in a cell on peri (COP) structure, the integrated circuit layer including the peripheral circuit and/or the core circuit may be arranged on the substrate 101 and the memory cells may be arranged on the integrated circuit layer, which will be described in detail later.

The first electrode line layer 110L may include a plurality of first electrode lines 110 that extend in parallel in a first direction X. The second electrode line layer 120L may include a plurality of second electrode lines 120 that extend in parallel in a second direction Y that intersects the first direction X. The first direction X and the second direction Y may perpendicularly intersect each other.

In terms of driving the variable resistance memory device 100, the first electrode lines 110 may correspond to word lines (e.g., WL1 and WL2 in FIG. 1) and the second electrode lines 120 may correspond to bit lines (e.g., BL1, BL2, BL3, and BL4 of FIG. 1). In some embodiments, the first electrode lines 110 may correspond to the bit lines and the second electrode lines 120 may correspond to the word lines.

The first electrode lines 110 and the second electrode lines 120 may be formed of a metal, a conductive metal nitride, a conductive metal oxide, or a combination of the above materials. For example, the first electrode lines 110 and the second electrode lines 120 may be formed of tungsten (W), tungsten nitride (WN), gold (Au), silver (Ag), copper (Cu), aluminium (Al), titanium aluminium nitride (TiAlN), iridium (Ir), platinum (Pt), palladium (Pd), ruthenium (Ru), zirconium (Zr), rhodium (Rh), nickel (Ni), cobalt (Co), chrome (Cr), tin (Sn), zinc (Zn), indium tin oxide (ITO), an alloy of the above metals, or a combination of the above metals. In addition, each of the first electrode lines 110 and the second electrode lines 120 may include a metal film and a conductive barrier layer that covers at least a part of the metal film. The conductive barrier layer may be formed of, for example, titanium (Ti), titanium nitride (TiN), tantalum (Ta), tantalum nitride (TaN), or a combination of the above metals.

The memory cell layer MCL may include a plurality of memory cells 140 (MC in FIG. 1) spaced apart from each other in the first direction X and the second direction Y. As illustrated in FIGS. 2 and 3, the first electrode lines 110 and the second electrode lines 120 may overlap each other (e.g., intersect in a plan view). The memory cells 140 may be arranged in portions in which the first electrode lines 110 and the second electrode lines 120 overlap each other and between the first electrode line layer 110L and the second electrode line layer 120L.

The memory cells 140 may be square pillar-shaped (e.g., a rectangular prism). However, the memory cells 140 are not limited to being square pillar-shaped. For example, the memory cells 140 may be cylindrical, elliptic cylindrical, or faceted cylindrical. In addition, in the variable resistance memory device 100 according to the inventive concepts, the memory cells 140 may be square pillar-shaped with a variable dimension. For example, in the square pillar, a width W2 (e.g., in a direction substantially parallel to a major surface of the substrate 101) of an upper portion may be larger than a width W1 of a lower portion. That is, the memory cells 140 may have a trapezoidal shaped profile.

A difference between the width W1 of the lower portion and the width W2 of the upper portion may be reduced by precisely controlling processes of forming the memory cells 140 and etching material layers so that side surfaces of the memory cells 140 are almost vertical.

Each of the memory cells 140 may include a lower electrode layer 141, a selection device layer 143, an intermediate electrode layer 145, a variable resistance layer 147, and an upper electrode layer 149. The use of the terms "upper," "intermediate," and "lower" are not intended to be limiting with respect to the relative orientation of the respective layers. In some embodiments, the lower electrode layer 141 may be referred to as a first electrode layer, the intermediate electrode layer 145 may be referred to as a second electrode layer, and the upper electrode layer 149 may be referred to as a third electrode layer.

In some embodiments, the variable resistance layer 147 (ME in FIG. 1) may include a phase change material that reversibly changes between an amorphous state and a crystalline state in accordance with a heating time. For example, the variable resistance layer 147 may have a phase of its phase change material reversibly change due to Joule heat generated by a voltage applied to both ends thereof and may include a material of which resistance may change due to such a change in phase. In detail, the phase change material may be in a high resistance state in an amorphous phase and may be in a low resistance state in a crystalline phase. Data may be stored in the variable resistance layer 147 by defining the high resistance state as '0' and the low resistance state as '1'.

In some embodiments, the variable resistance layer 147 may include a chalcogenide material as the phase change material. For example, the variable resistance layer 147 may include germanium (Ge)-antimony (Sb)-tellurium (Te) (GST). A hyphenated (-) chemical composition represents an element included in a certain mixture or compound and may represent all chemical formulas including the represented element. For example, Ge—Sb—Te may be a material such as $Ge_2Sb_2Te_5$, $Ge_2Sb_2Te_7$, $Ge_1Sb_2Te_4$, or $Ge_1Sb_4Te_7$.

The variable resistance layer 147 may include various chalcogenide materials other than the above-described Ge—Sb—Te (GST). For example, the variable resistance layer 147 as the chalcogenide material may include at least two selected from silicon (Si), Ge, Sb, Te, bismuth (Bi), indium (In), tin (Sn), and selenium (Se) or a combination thereof.

Chemical stoichiometry of each element that forms the variable resistance layer 147 may vary. In accordance with the chemical stoichiometry of each element, a phase change speed and information retention in accordance with a crystallization temperature, a melting point, and/or crystallization energy of the variable resistance layer 147 may be controlled.

In some embodiments, the variable resistance layer 147 may further include at least one impurity selected from carbon (C), nitrogen (N), Si, oxygen (O), Bi, and Sn. A driving current of the variable resistance memory device 100 may change due to the impurity. In addition, the variable resistance layer 147 may further include a metal. For example, the variable resistance layer 147 may include at least one selected from Al, gallium (Ga), Zn, Ti, Cr, manganese (Mn), iron (Fe), Co, Ni, molybdenum (Mo), ruthenium (Ru), palladium (Pd), hafnium (Hf), Ta, Ir, Pt, zirconium (Zr), thallium (Tl), and polonium (Po). The metal materials may increase electrical conductivity and/or thermal conductivity of the variable resistance layer 147. Therefore, it is possible to increase a set speed by increasing the crystallization speed. In addition, the metal materials may improve the information retention characteristic of the variable resistance layer 147.

The variable resistance layer 147 may have a multilayer structure in which no less than two layers having different properties are stacked. The number or thicknesses of layers may be freely selected. A barrier layer may be further formed between the layers. The barrier layer may prevent or reduce a material from diffusing between the layers. That is, the barrier layer may prevent or reduce diffusion of a previous layer when a subsequent layer is formed in the layers.

In addition, the variable resistance layer 147 may have a super-lattice structure in which the layers including different materials are alternately stacked. For example, the variable resistance layer 147 may have a structure in which a first layer formed of Ge—Te and a second layer formed of Sb—Te are alternately stacked. Materials of the first layer and the second layer are not limited to Ge—Te and Sb—Te and the above-described various materials may be used.

It is illustrated that the variable resistance layer 147 includes the phase change material. However, the inventive concepts are not limited thereto. The variable resistance layer 147 of the variable resistance memory device 100 may include various materials having a resistance change characteristic.

In some embodiments, when the variable resistance layer 147 includes a transition metal oxide, the variable resistance memory device 100 may be resistive random access memory (ReRAM). In the variable resistance layer 147 including the transition metal oxide, at least one electrical path may be generated or extinguished by a program operation. When the electrical path is generated, the variable resistance layer 147 may have a low resistance value. When the electrical path is extinguished, the variable resistance layer 147 may have a high resistance value. The variable resistance memory device 100 may store data by using a difference in resistance value of the variable resistance layer 147.

When the variable resistance layer 147 is formed of the transition metal oxide, the transition metal oxide may include at least one metal selected from Ta, Zr, Ti, Hf, Mn, yttrium (Y), Ni, Co, Zn, niobium (Nb), Cu, Fe, and Cr. For example, the transition metal oxide may be a single layer or a multilayer formed of at least one selected from $Ta_2O_{5-x}$, $ZrO_{2-x}$, $TiO_{2-x}$, $HfO_{2-x}$, $MnO_{2-x}$, $Y_2O_{3-x}$, $NiO_{1-y}$, $Nb_2O_{5-x}$, $CuO_{1-y}$, and $Fe_2O_{3-x}$. In the above materials, x and y may be respectively selected in a range of $0 \leq x \leq 1.5$ and in a range of $0 \leq y \leq 0.5$. However, the inventive concepts are not limited thereto.

In other embodiments, when the variable resistance layer 147 has a magnetic tunnel junction structure including two electrodes formed of a magnetic substance and a dielectric substance interposed between the two magnetic substance electrodes, the variable resistance memory device 100 may be a magnetic RAM (MRAM). The two electrodes may be a magnetization pinned layer and a magnetization free layer and the dielectric substance interposed therebetween may be a tunnel barrier layer. The magnetization pinned layer has a magnetization direction pinned in one direction and the magnetization free layer may have a magnetization direction that may change so as to be parallel or semi-parallel in the magnetization direction of the magnetization pinned layer. The magnetization directions of the magnetization pinned layer and the magnetization free layer may be parallel with one surface of the tunnel barrier layer. However, the inventive concepts are not limited thereto. The magnetization directions of the magnetization pinned layer and the magnetization free layer may be perpendicular to one surface of the tunnel barrier layer.

When the magnetization direction of the magnetization free layer is parallel with the magnetization direction of the magnetization pinned layer, the variable resistance layer 147 may have a first resistance value. When the magnetization direction of the magnetization free layer is semi-parallel with the magnetization direction of the magnetization pinned layer, the variable resistance layer 147 may have a second resistance value. The variable resistance memory device 100 may store data by using the difference in resistance value. The magnetization direction of the magnetization free layer may be changed by the spin torque of electrons in the program current.

The magnetization pinned layer and the magnetization free layer may include a magnetic material. In some embodiments, the magnetization pinned layer may further include a semi-ferroelectric material for pinning the magnetization direction of a ferroelectric material in the magnetization pinned layer. The tunnel barrier layer may be formed of an oxide selected from Mg, Ti, Al, MgZn, and MgB. However, the inventive concepts are not limited thereto.

The selection device layer 143 (e.g., SW in FIG. 1) may be a current correct layer for controlling flow of a current. The selection device layer 143 may include a material layer of which resistance may change in accordance with a magnitude of a voltage applied to both ends of the selection device layer 143. For example, the selection device layer 143 may include an ovonic threshold switching (OTS) material. A function of the selection device layer 143 based on the OTS material will be described. When a voltage that is lower than a threshold voltage Vt is applied to the selection device layer 143, the selection device layer 143 may maintain a high resistance state in which a current flow is small or non-existent. When a voltage that is higher than the threshold voltage Vt is applied to the selection device layer 143, the selection device layer 143 may be in a low resistance state so that a current starts to flow and/or increase. In addition, when the current that flows through the selection device layer 143 is smaller than a holding current, the selection device layer 143 may change into a high resistance state.

The selection device layer 143 may include a chalcogenide switching material as the OTS material. In some embodiments, the chalcogenide switching material includes arsenic (As) and may further include at least two selected from Si, Ge, Sb, Te, Se, In, and Sn. In other embodiments, the chalcogenide switching material includes Se and may further include at least two selected from Si, Ge, Sb, Te, As, In, and Sn.

In general, in chalcogen elements, divalent bonding and lone pair electrons exist. The divalent bonding leads to formation of a chain and loop structure by combining the chalcogen elements in order to form a chalcogenide material, and the lone pair electrons provide an electronic source for forming a conductive filament. For example, trivalent and tetravalent modifying agents such as Al, Ga, In, Ge, Sn, Si, phosphorus (P), As, and Sb enter the chain and loop structure of the chalcogen element to determine structural stiffness of the chalcogenide material and divide the chalcogenide material into a switching material and a phase change material in accordance with a capability of performing crystallization or another structural realignment.

The lower electrode layer 141, the intermediate electrode layer 145, and the upper electrode layer 149 that function as current paths may be formed of a conductive material. For example, the lower electrode layer 141, the intermediate electrode layer 145, and the upper electrode layer 149 may be formed of a metal, a conductive metal nitride, a conductive metal oxide, or a combination of the above materials. For example, the lower electrode layer 141, the intermediate electrode layer 145, and the upper electrode layer 149 may include at least one selected from C, TiN, TiSiN, TiCN, TiCSiN, TiAlN, Ta, TaN, W, and WN. However, the inventive concepts are not limited thereto.

The lower electrode layer 141 and the upper electrode layer 149 may be selectively formed. That is, the lower electrode layer 141 and the upper electrode layer 149 may be omitted. In order to prevent and/or reduce contamination or contact failure from occurring since the selection device layer 143 and the variable resistance layer 147 directly contact the first and second electrode lines 110 and 120, the lower electrode layer 141 and the upper electrode layer 149 may be arranged between the first and second electrode lines 110 and 120 and the selection device layer 143 and the variable resistance layer 147.

A first insulating layer 160a may be arranged among (e.g., between adjacent ones of) the first electrode lines 110, and a second insulating layer 160b may be arranged among (e.g., between adjacent ones of) the memory cells 140 of the memory cell layer MCL. In addition, a third insulating layer 160c may be arranged among (e.g., between adjacent ones of) the second electrode lines 120. The first to third insulating layers 160a, 160b, and 160c may be formed of the same material, or at least one of the first to third insulating layers 160a, 160b, and 160c may be formed of another material different from other ones of the first to third insulating layers 160a, 160b, and 160c. The first to third insulating layers 160a, 160b, and 160c may be formed of, for example, a dielectric material such as a silicon oxide or a silicon nitride and may electrically isolate elements of each layer from each other.

In the variable resistance memory device 100 according to the inventive concepts, the second insulating layer 160b including air gaps AG may be arranged among the memory cells 140. In some embodiments, the second insulating layer 160b may include the air gaps AG that surround (e.g., in a plan view) the memory cells 140 while intersecting each other in the first direction X and the second direction Y. As illustrated in FIG. 4, the air gaps AG may be arranged to surround the memory cells 140 in an interconnected structure such that portions of respective ones of the air gaps AG are connected with portions of at least one other air gap AG. That is, the memory cells 140 share the air gaps AG with other memory cells 140 that are adjacent in the first direction X and/or the second direction Y so that the air gaps AG may be arranged on all (e.g., four, when the memory cells have a square cross-section) side surfaces of the memory cells 140. In some embodiments, two memory cells 140 sharing an air gap AG refers to a single air gap AG being disposed between two adjacent memory cells 140.

The second insulating layer 160b may include a silicon oxide, a silicon nitride, and/or a silicon oxynitride. In some embodiments, the second insulating layer 160b may be formed of a low dielectric (low-k) material layer having a smaller dielectric constant than the silicon oxide. For example, a dielectric material that forms the second insulating layer 160b may be an oxide such as a phosphor silicate glass (PSG) oxide, a boro-phosphor silicate glass (BPSG) oxide, an undoped silicate glass (USG) oxide, a tetraethyl orthosilicate (TEOS) oxide, a plasma enhanced-TEOS (PE-TEOS) oxide, a high density plasma-chemical vapour deposition (HDP-CVD) oxide, and/or an ultra-low dielectric material.

The second insulating layer 160b may be a material layer formed by a process with poor step coverage, which will be described later. The air gaps AG may refer to portions in which the second insulating layer 160b does not fill the spaces among the memory cells 140. That is, since a height to width ratio of each of the spaces among the memory cells 140 is very large, in order to fill the spaces, a process with good step coverage is to be used. However, in the variable resistance memory device 100 according to the inventive concept, in order to form the air gaps AG, the second insulating layer 160b may be intentionally formed by a process with poor step coverage.

In addition, in the variable resistance memory device 100 according to the inventive concepts, each of the memory cells 140 may have a structure in which the width W2 of the upper portion is larger than the width W1 of the lower portion. Therefore, overhangs may be formed on the memory cells 140 in the process of forming the second insulating layer 160b so that the air gaps AG that are portions in which the spaces among the memory cells 140 are not completely filled may be formed to be larger.

The air gaps AG may include air having a small dielectric constant. That is, since the air gaps AG including air having a dielectric constant of about 1 are formed among the memory cells 140, parasitic capacitance among the memory cells 140 may be remarkably reduced and cross-talk among the memory cells 140 may be reduced. Therefore, performance of the variable resistance memory device 100 may improve.

As spaces occupied by the air gaps AG are larger, parasitic capacitance and cross-talk among the memory cells 140 may be reduced. Therefore, in some embodiments, the process of forming the second insulating layer 160b may be performed so that a level of an uppermost surface AGT of each of the air gaps AG is higher than a level of an upper surface 145T of the intermediate electrode layer 145.

Figure 5:
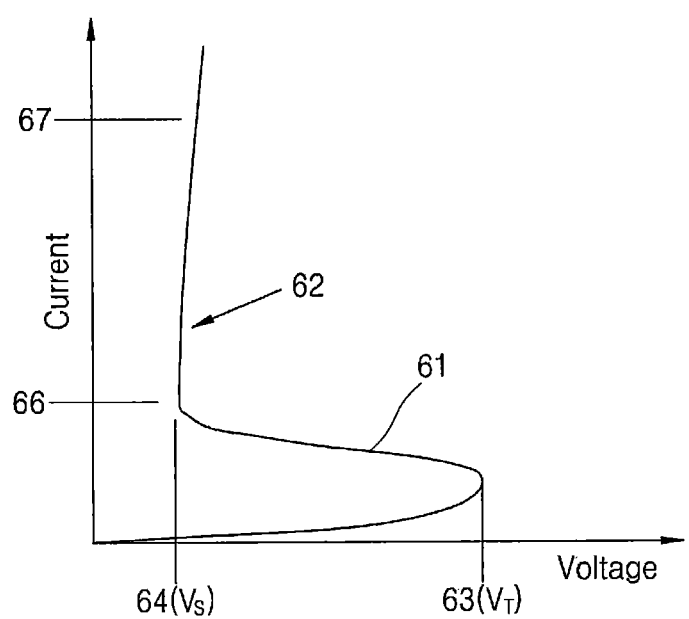
FIG. 5 is a graph schematically illustrating a voltage-current curve of a selection device layer.

FIG. 5 is a graph schematically illustrating a voltage-current curve of a selection device layer.

Referring to FIG. 5, a first curve 61 represents a voltage-current relation in a state in which a current does not flow through the selection device layer. Here, the selection device layer (143 of FIG. 2) may operate as a switching device having a threshold voltage Vt of a first voltage level 63. When a voltage gradually increases from a state in which a voltage and a current are 0, only a small or minimal current may flow through the selection device layer until the voltage reaches the threshold voltage Vt. However, as soon as the voltage exceeds the threshold voltage Vt, the current that flows through the selection device layer may rapidly increase and a voltage applied to the selection device layer may be reduced to a saturation voltage Vs.

A second curve 62 represents a voltage-current relation in a state in which a current flows through the selection device layer (e.g., an increased current after the voltage reaches the threshold voltage Vt). As the current that flows through the selection device layer is larger than a first current level 66, the voltage applied to the selection device layer may increase slightly from a second voltage level 64. For example, while the current that flows through the selection device layer increases from the first current level 66 to a second current level 67, the voltage applied to the selection device layer may slightly increase from the second voltage level 64. That is, when the current flows through the selection device layer, the voltage applied to the selection device layer may be maintained almost as the saturation voltage Vs. If a current is reduced to no more than a maintained current level, the selection device layer is transitioned again to a resistance state so that a current may be effectively blocked until the voltage increases to the threshold voltage Vt.

Figure 6:
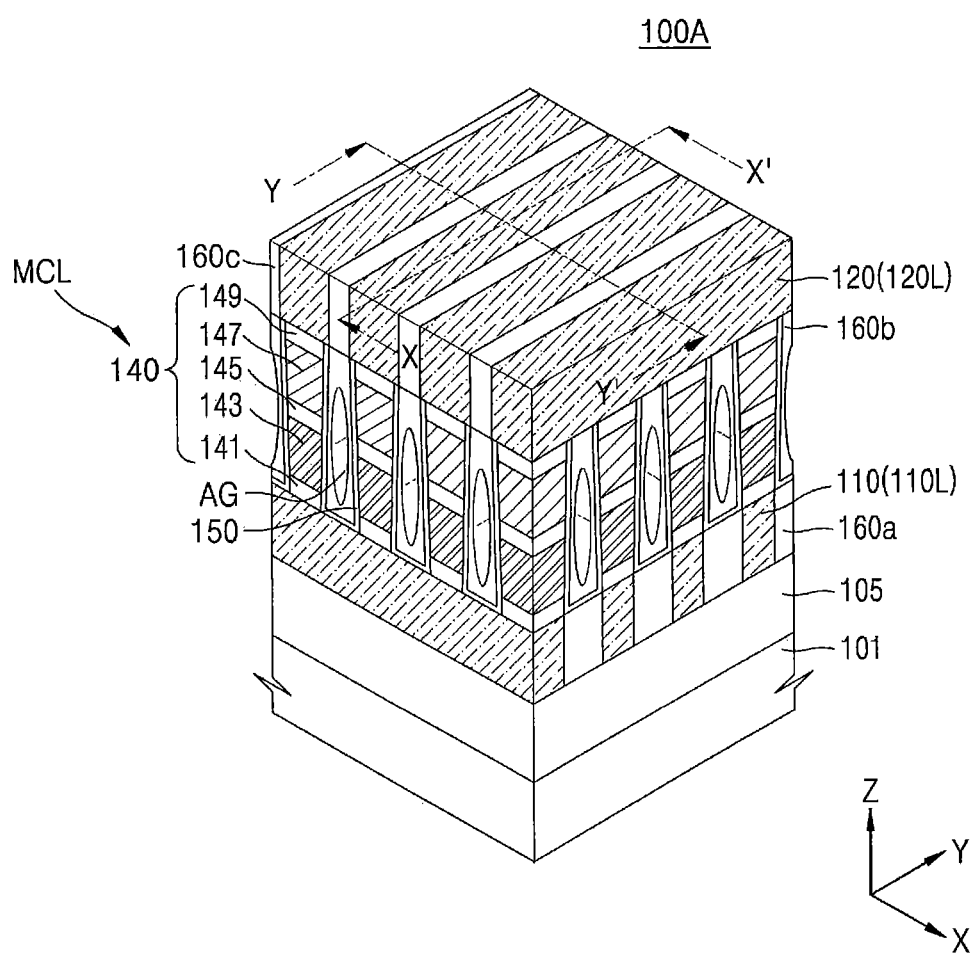
FIG. 6 is a perspective view illustrating a variable resistance memory device according to an embodiment of the inventive concepts.
Figure 7:
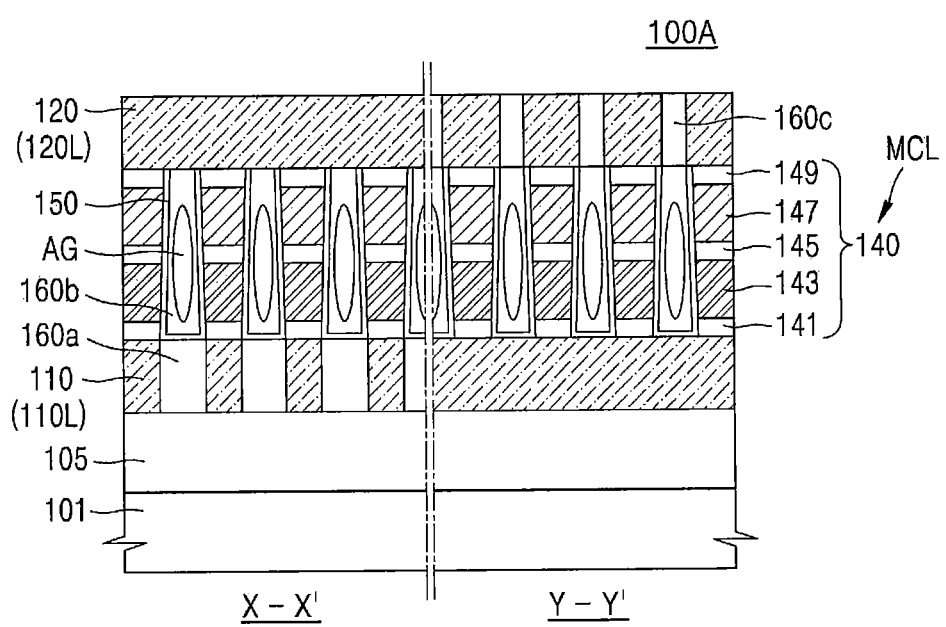
FIG. 7 is a cross-sectional view taken along lines X-X' and Y-Y' of FIG. 6.

FIG. 6 is a perspective view illustrating a variable resistance memory device 100A according to an embodiment of the inventive concepts. FIG. 7 is a cross-sectional view taken along lines X-X' and Y-Y' of FIG. 6.

Components that form the variable resistance memory device 100A and a material that forms the components may be the same as, or similar to, the variable resistance memory device 100 described with respect to FIGS. 2 to 4. Therefore, for convenience sake, description will be made based on a difference between the variable resistance memory device 100A and the variable resistance memory device 100.

Referring to FIGS. 6 and 7 together, a protective layer 150 may be conformally provided along a side surface of each of the plurality of memory cell layers MCL and an upper surface of the interlayer insulating layer 105. In some embodiments, the protective layer 150 may be on an upper surface of the first electrode line layer 110L.

The protective layer 150 may include, for example, a silicon oxide, a silicon nitride, and/or a silicon oxynitride. In some embodiments, the protective layer 150 may include the same or similar material as the second insulating layer 160b.

The protective layer 150 may be formed of a process with good step coverage. For example, the protective layer 150 may be formed by an atomic layer deposition (ALD) process or a plasma enhanced chemical vapor deposition (PECVD) process.

The second insulating layer 160b including the air gaps AG may be arranged among the memory cells 140. The second insulating layer 160b may include the air gaps AG that surround (e.g., are on all side surfaces of) the memory cells 140 while intersecting each other in the first direction X and the second direction Y. That is, the memory cells 140 may share the air gaps AG with other memory cells 140 that are adjacent in the first direction X and the second direction Y.

Figure 8:
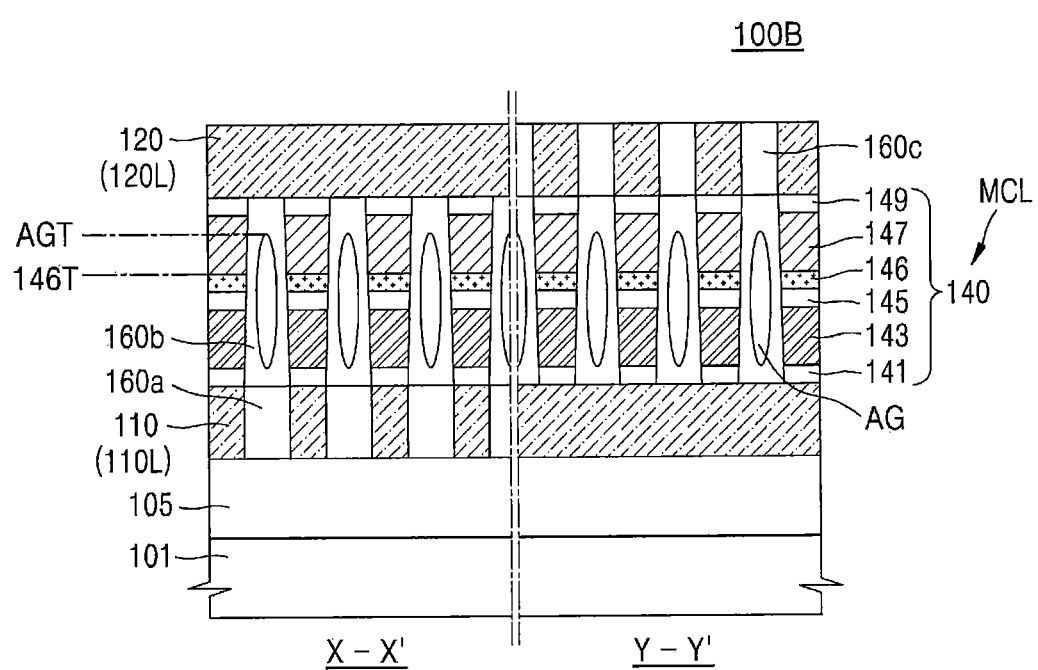
FIGS. 8 and 9 are cross-sectional views illustrating variable resistance memory devices according to an embodiment of the inventive concepts and correspond to the cross-sectional view of FIG. 7.
Figure 9:
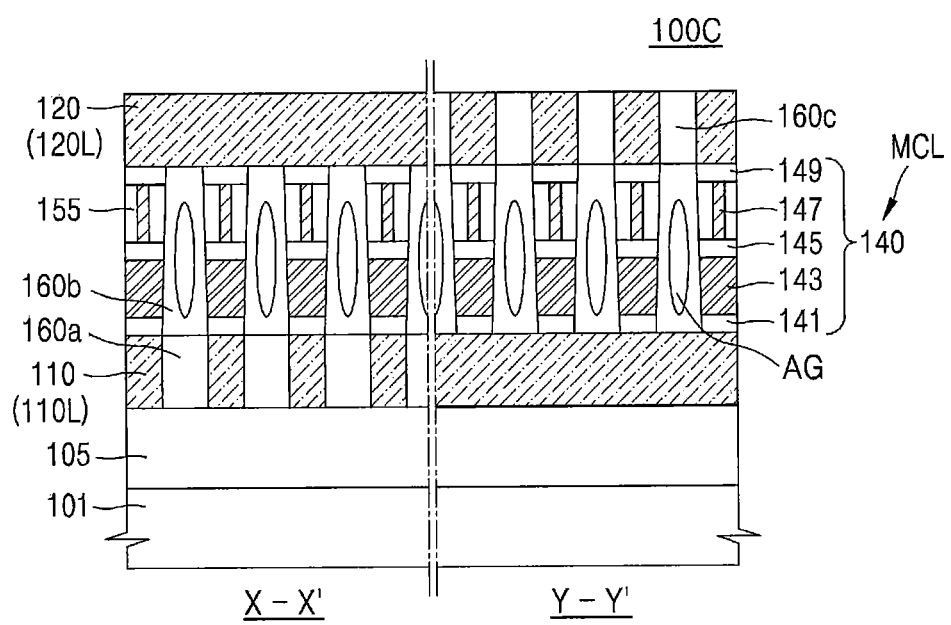

FIGS. 8 and 9 are cross-sectional views illustrating variable resistance memory devices 100B and 100C according to an embodiment of the inventive concepts and correspond to the cross-sectional view of FIG. 7.

Components that form the variable resistance memory devices 100B and 100C and a material that forms the components may be the same as, or similar to, the variable resistance memory device 100 described in FIGS. 2 to 4. Therefore, for convenience sake, description will be made based on a difference between the variable resistance memory devices 100B and 100C and the variable resistance memory device 100.

Referring to FIG. 8, a heating electrode layer 146 may be arranged between the intermediate electrode layer 145 and the variable resistance layer 147 to contact the variable resistance layer 147.

The heating electrode layer 146 may heat the variable resistance layer 147 in a set or reset operation. The heating electrode layer 146 may include a conductive material capable of generating enough heat to phase change the variable resistance layer 147 without reacting to the variable resistance layer 147. The heating electrode layer 146 may include a carbon-based conductive material. In some embodiments, the heating electrode layer 146 may be formed of, for example, TiN, TiSiN, TiAlN, TaSiN, TaAlN, TaN, WSi, WN, TiW, MoN, NbN, TiBN, ZrSiN, WSiN, WBN, ZrAlN, MoAlN, TiAl, TiON, TiAlON, WON, TaON, C, SiC, SiCN, CN, TiCN, TaCN, a high fusion point metal that is a combination of the above materials, or a nitride of the above material, though the material of the heating electrode layer 146 is not limited thereto.

In some embodiments, the intermediate electrode layer 145 may be provided in order to prevent heat from the heating electrode layer 146 from being transmitted to the selection device layer 143. In general, the selection device layer 143 may include an amorphous chalcogenide switching material. However, in accordance with a down scaling trend of the variable resistance memory device 100B, thicknesses and widths of the variable resistance layer 147, the selection device layer 143, the heating electrode layer 146, and the intermediate electrode layer 145 and intervals among the layers may be reduced. Therefore, in a process of driving the variable resistance memory device 100B, when the heating electrode layer 146 emits heat and phase changes the variable resistance layer 147, the selection device layer 143 adjacent to the heating electrode layer 146 may be affected by the heating. For example, the selection device layer 143 may be partially crystallized by heat from the heating electrode layer 146 adjacent to the selection device layer 143 so that the selection device layer 143 may be deteriorated and/or damaged.

In some embodiments, in the variable resistance memory device 100B, the intermediate electrode layer 145 may be formed to be thick so that the heat of the heating electrode layer 146 is not transmitted to the selection device layer 143.

In FIG. 8, the intermediate electrode layer 145 is formed to have a similar thickness to thicknesses of the lower electrode layer 141 and the upper electrode layer 149. However, for a heat blocking function, the intermediate electrode layer 145 may be formed to be thicker than the lower electrode layer 141 or the upper electrode layer 149. For example, the intermediate electrode layer 145 may have a thickness of about 10 nm to about 100 nm. However, the inventive concepts are not limited thereto. In addition, the intermediate electrode layer 145 may include at least one thermal barrier layer for the heat blocking function. When the intermediate electrode layer 145 includes two or more thermal barrier layers, the intermediate electrode layer 145 may have a structure in which the thermal barrier layers and an electrode material layer are alternately stacked.

The second insulating layer 160b including the air gaps AG may be arranged among the memory cells 140. The second insulating layer 160b may include the air gaps AG that surround the memory cells 140 (e.g., on all side surfaces of) while intersecting each other in the first direction X and the second direction Y. That is, the memory cells 140 may share the air gaps AG with other memory cells 140 that are adjacent in the first direction X and the second direction Y.

As spaces occupied by the air gaps AG are larger, parasitic capacitance and cross-talk among the memory cells 140 may be reduced. Therefore, in some embodiments, the process of forming the second insulating layer 160b may be performed so that a level of an uppermost surface AGT of each of the air gaps AG is higher than a level of an upper surface 146T of the heating electrode layer 146.

Referring to FIG. 9, the variable resistance memory device 100C may be different from the variable resistance memory device (100 of FIG. 2) in that the variable resistance layer 147 is formed to have a dash-shaped structure.

In the variable resistance memory device 100C, the lower electrode layer 141, the selection device layer 143, the intermediate electrode layer 145, and the upper electrode layer 149 are formed by a dry etching process and the variable resistance layer 147 may be formed by a damascene process. The variable resistance layer 147 may have a structure among, for example, a pillar structure, a horn structure, an L-shaped structure, and a dash-shaped structure. Here, the variable resistance layer 147 is illustrated as having the dash-shaped structure.

The variable resistance layer 147 is formed to have the dash-shaped structure as follows. In some embodiments, after forming a first material layer that forms the variable resistance layer 147 to be thin, the first material layer is left only as a side wall by performing anisotropic etching. Then, a second material layer that forms an upper spacer 155 is formed to cover the remaining first material layer. Then, planarization is performed by a chemical mechanical polishing (CMP) process so that an upper surface of the first material layer is exposed. After performing planarization, a mask pattern aligned in the memory cells 140 is formed and the second material layer is etched by using the mask pattern so that the variable resistance layer 147 having a dash type structure and the upper spacer 155 that surrounds the variable resistance layer 147 may be formed.

The second insulating layer 160b including the air gaps AG may be arranged among the memory cells 140. The second insulating layer 160b may include the air gaps AG that surround the memory cells 140 while intersecting each other in the first direction X and the second direction Y. That is, the memory cells 140 may share the air gaps AG with other memory cells 140 that are adjacent in the first direction X and the second direction Y.

Figure 10:
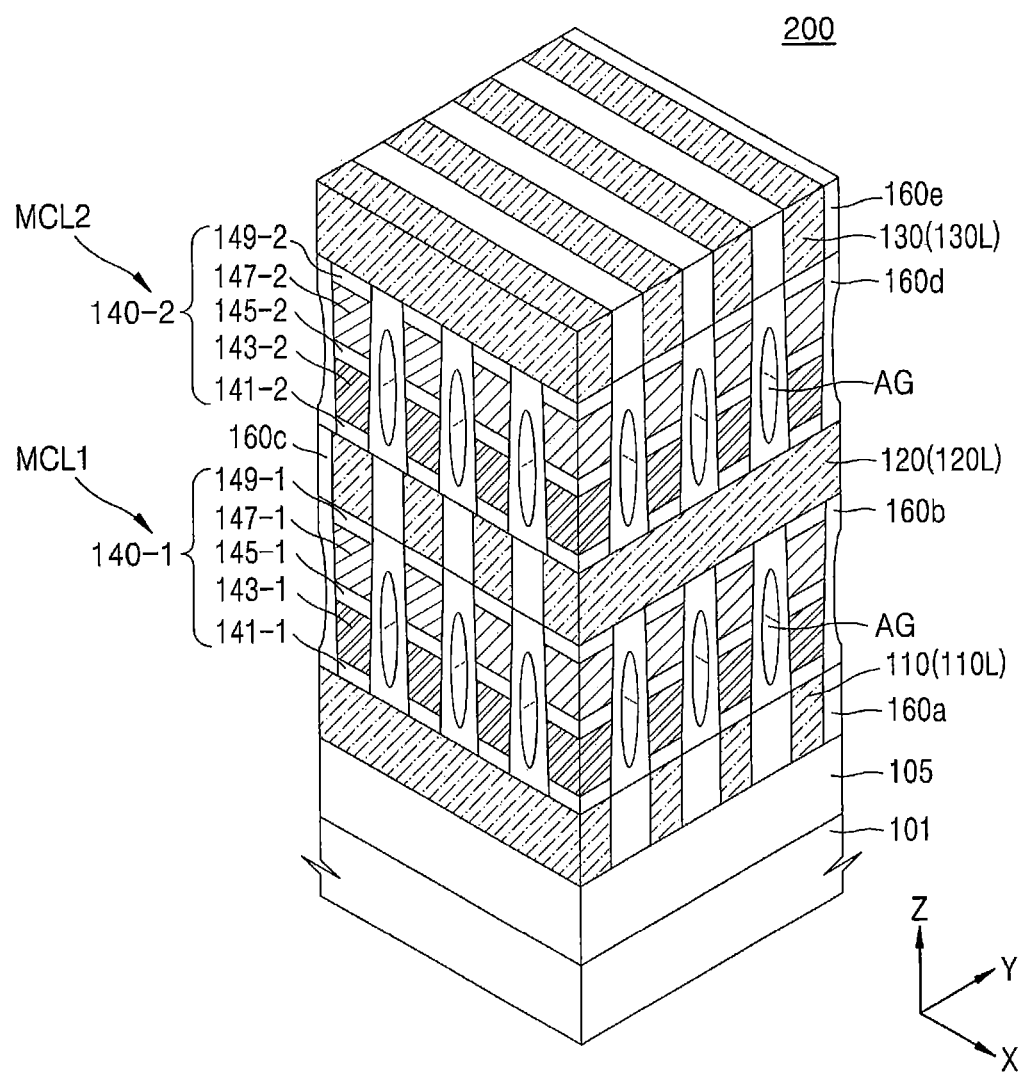
FIG. 10 is a perspective view illustrating a variable resistance memory device according to an embodiment of the inventive concepts.

FIG. 10 is a perspective view illustrating a variable resistance memory device 200 according to an embodiment of the inventive concepts.

Referring to FIG. 10, the variable resistance memory device 200 may include a first electrode line layer 110L, a second electrode line layer 120L, a third electrode line layer 130L, a first memory cell layer MCL1, and a second memory cell layer MCL2.

As illustrated in FIG. 10, the interlayer insulating layer 105 may be arranged on the substrate 101. The first electrode line layer 110L may include a plurality of first electrode lines 110 that extend in parallel in the first direction X. The second electrode line layer 120L may include a plurality of second electrode lines 120 that extend in parallel in the second direction Y perpendicular to the first direction X. In addition, the third electrode line layer 130L may include a plurality of third electrode lines 130 that extend in parallel in the first direction X. In some embodiments, the third electrode lines 130 may be substantially the same as the first electrode lines 110 in terms of a extending direction or an arrangement structure excluding that a position in the third direction Z varies. Therefore, the third electrode lines 130 may be referred to as the first electrode lines of the third electrode line layer 130L.

In terms of driving of the variable resistance memory device 200, the first electrode lines 110 and the third electrode lines 130 may correspond to word lines and the second electrode lines 120 may correspond to bit lines. In some embodiments, the first electrode lines 110 and the third electrode lines 130 may correspond to bit lines and the second electrode lines 120 may correspond to word lines. When the first electrode lines 110 and the third electrode lines 130 correspond to the word lines, the first electrode lines 110 may correspond to lower word lines, the third electrode lines 130 may correspond to upper word lines, and the second electrode lines 120 may correspond to common bit lines, since the second electrode lines 120 are shared by the lower word lines and the upper word lines.

The first electrode lines 110, the second electrode lines 120, and the third electrode lines 130 may be formed of a metal, a conductive metal nitride, a conductive metal oxide, or a combination of the above materials. In addition, each of the first electrode lines 110, the second electrode lines 120, and the third electrode lines 130 may include a metal film and a conductive barrier layer that covers at least a part of the metal film.

The first memory cell layer MCL1 may include a plurality of first memory cells 140-1 spaced apart from each other in the first direction X and the second direction Y. The second memory cell layer MCL2 may include a plurality of second memory cells 140-2 spaced apart from each other in the first direction X and the second direction Y. As illustrated in FIG. 10, the first electrode lines 110 and the second electrode lines 120 may overlap each other (e.g., intersect in a plan view) and the second electrode lines 120 and the third electrode lines 130 may overlap each other (e.g., intersect in a plan view). The first memory cells 140-1 may be arranged in portions in which the first electrode lines 110 and the second electrode lines 120 overlap each other, and may be arranged between the first electrode line layer 110L and the second electrode line layer 120L. The second memory cells 140-2 may be arranged in portions in which the second electrode lines 120 and the third electrode lines 130 overlap each other, and may be arranged between the second electrode line layer 120L and the third electrode line layer 130L.

The first memory cells 140-1 and the second memory cells 140-2 may include lower electrode layers 141-1 and 141-2, selection device layers 143-1 and 143-2, intermediate electrode layers 145-1 and 145-2, variable resistance layers 147-1 and 147-2, and upper electrode layers 149-1 and 149-2, respectively. Structures of the first memory cells 140-1 and the second memory cells 140-2 may be substantially the same.

The first insulating layer 160a may be arranged between the first electrode lines 110 and a second insulating layer 160b may be arranged between the first memory cells 140-1 of the first memory cell layer MCL1. In addition, a third insulating layer 160c may be arranged between the second electrode lines 120, a fourth insulating layer 160d may be arranged between the second memory cells 140-2 of the second memory cell layer MCL2, and a fifth insulating layer 160e may be arranged between the third electrode lines 130. The first to fifth insulating layers 160a to 160e may be formed of the same material, or at least one of the first to fifth insulating layers 160a to 160e may be formed of another material different from other ones of the first to fifth insulating layers 160a to 160e. The first to fifth insulating layers 160a to 160e may be formed of a dielectric material such as a silicon oxide and/or a silicon nitride and may electrically isolate devices of each layer from each other.

In some embodiments, air gaps AG may be included in at least one of the second insulating layer 160b and the fourth insulating layer 160d.

In some embodiments, the second insulating layer 160b including the air gaps AG may be arranged between the first memory cells 140-1. The second insulating layer 160b may include the air gaps AG that surround (e.g., are on all side surfaces of) the first memory cells 140-1 while intersecting each other in the first direction X and the second direction Y. That is, the first memory cells 140-1 may share the air gaps AG with other first memory cells 140-1 that are adjacent in the first direction X and/or the second direction Y.

In addition, the fourth insulating layer 160d including the air gaps AG may be arranged between the second memory cells 140-2. The fourth insulating layer 160d may include the air gaps AG that surround (e.g., are on all side surfaces of) the second memory cells 140-2 while intersecting each other in the first direction X and the second direction Y. That is, the second memory cells 140-2 may share the air gaps AG with other second memory cells 140-2 that are adjacent in the first direction X and the second direction Y.

The variable resistance memory device 200 may have a structure in which the variable resistance memory device 100 having the structure of FIGS. 2 to 4 is repeatedly stacked. However, the structure of the variable resistance memory device 200 is not limited thereto. For example, the variable resistance memory device 200 may have a structure in which variable resistance memory devices 100A, 100B, and 100C of various structures illustrated in FIGS. 6 to 9 are stacked.

Figure 11:
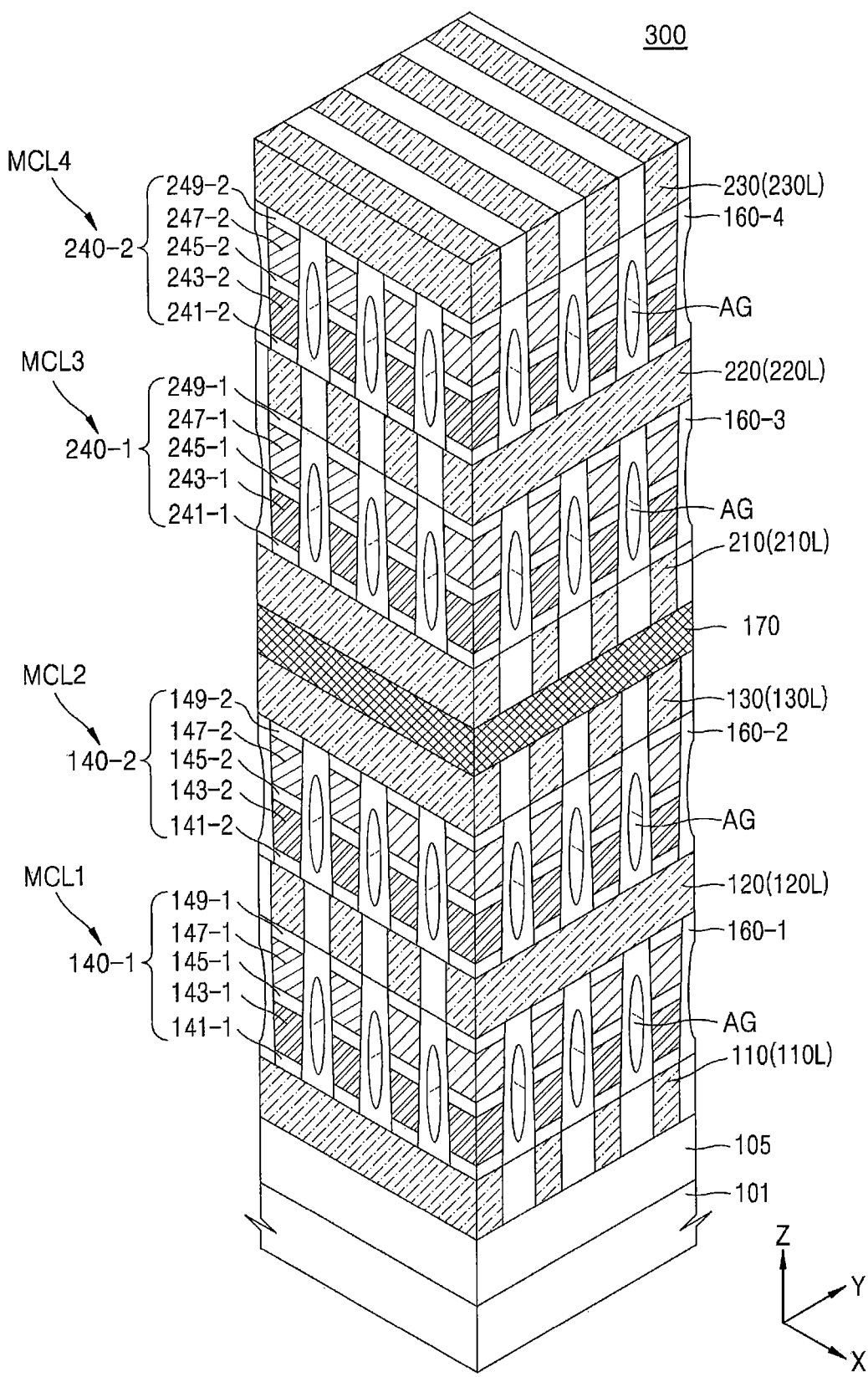
FIG. 11 is a perspective view illustrating a variable resistance memory device according to an embodiment of the inventive concepts.

FIG. 11 is a perspective view illustrating a variable resistance memory device 300 according to an embodiment of the inventive concepts.

Referring to FIG. 11, the variable resistance memory device 300 may have a four-layer structure including four stacked memory cell layers MCL1, MCL2, MCL3, and MCL4. In detail, the first memory cell layer MCL1 may be arranged between the first electrode line layer 110L and the second electrode line layer 120L and the second memory cell layer MCL2 may be arranged between the second electrode line layer 120L and the third electrode line layer 130L. A second interlayer insulating layer 170 may be formed on the third electrode line layer 130L and a first upper electrode line layer 210L, a second upper electrode line layer 220L, and a third upper electrode line layer 230L may be arranged on the second interlayer insulating layer 170. The first upper electrode line layer 210L may include first upper electrode lines 210 having the same or similar structure as the first electrode lines 110, the second upper electrode line layer 220L include second upper electrode lines 220 having the same or similar structure as the second electrode lines 120, and the third upper electrode line layer 230L may include third upper electrode lines 230 having the same or similar structure as the third electrode lines 130 or the first electrode lines 110. The first upper memory cell layer MCL3 may be arranged between the first upper electrode line layer 210L and the second upper electrode line layer 220L and the second upper memory cell layer MCL4 may be arranged between the second upper electrode line layer 220L and the third upper electrode line layer 230L.

The first electrode line layer 110L to the third electrode line layer 130L, the first memory cell layer MCL1, and the second memory cell layer MCL2 are as previously described in FIG. 10. In addition, the first upper electrode line layer 210L to the third upper electrode line layer 230L, the first upper memory cell layer MCL3, and the second upper memory cell layer MCL4 may be substantially the same as the first electrode line layer 110L to the third electrode line layer 130L, the first memory cell layer MCL1, and the second memory cell layer MCL2, with the exception that the first upper electrode line layer 210L to the third upper electrode line layer 230L, the first upper memory cell layer MCL3, and the second upper memory cell layer MCL4 are arranged on the second interlayer insulating layer 170 instead of the interlayer insulating layer 105.

In some embodiments, insulating layers 160-1, 160-2, 160-3, and 160-4 including air gaps AG may be formed between the first to fourth memory cells 140-1, 140-2, 140-3, and 140-4. The insulating layers 160-1, 160-2, 160-3, and 160-4 may include the air gaps AG that respectively surround the first to fourth memory cells 140-1, 140-2, 140-3, and 140-4 while intersecting each other in the first direction X and the second direction Y. That is, the first to fourth memory cells 140-1, 140-2, 140-3, and 140-4 may respectively share the air gaps AG with other ones of the first to fourth memory cells 140-1, 140-2, 140-3, and 140-4 that are adjacent in the first direction X and the second direction Y.

The variable resistance memory device 300 may have a structure in which the variable resistance memory device 100 having the structure of FIGS. 2 to 4 is repeatedly stacked. However, the structure of the variable resistance memory device 300 is not limited thereto. For example, the variable resistance memory device 300 may have a structure in which the variable resistance memory devices 100A, 100B, and 100C of various structures illustrated in FIGS. 6 to 9 are stacked.

Figure 12:
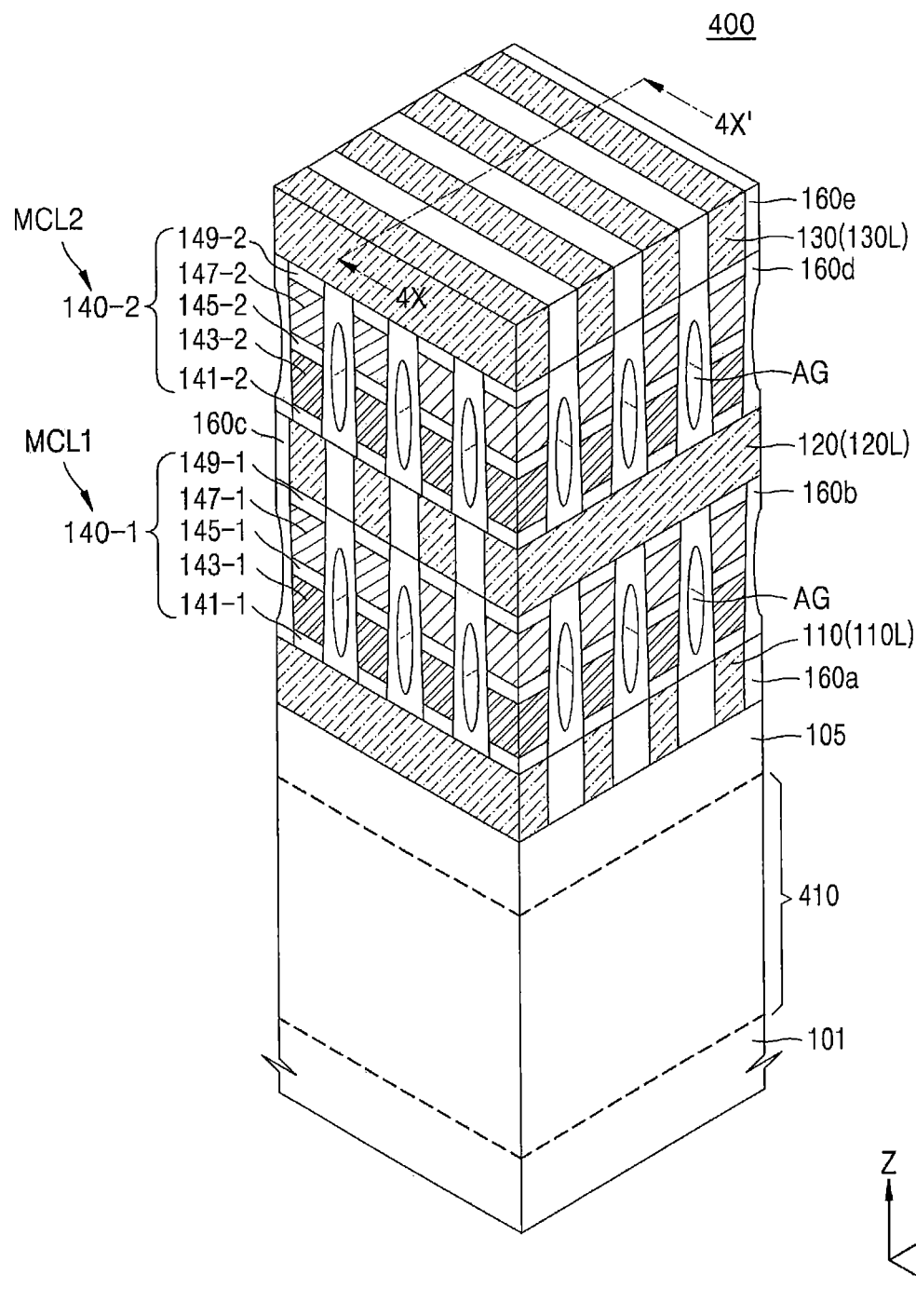
FIG. 12 is a perspective view illustrating a variable resistance memory device according to an embodiment of the inventive concepts.
Figure 13:
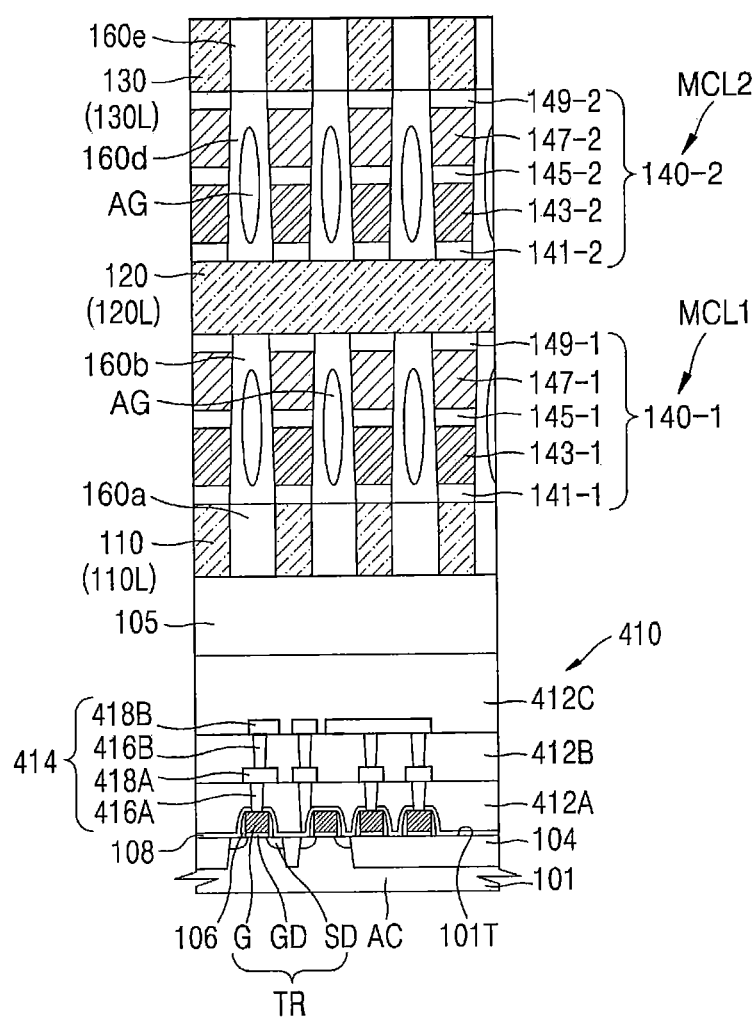
FIG. 13 is a cross-sectional view taken along a line 4X-4X' of FIG. 12.

FIG. 12 is a perspective view illustrating a variable resistance memory device 400 according to an embodiment of the inventive concepts. FIG. 13 is a cross-sectional view taken along the line 4X-4X' of FIG. 12.

Referring to FIGS. 12 and 13, the variable resistance memory device 400 may include a driving circuit region 410 formed at a first level on the substrate 101 and the first memory cell layer MCL1 and the second memory cell layer MCL2 formed at a second level on the substrate 101.

Here, the term 'level' means a height in the third direction Z perpendicular to the substrate 101. The first level is closer to a top surface 101T of the substrate than the second level on the substrate 101.

In the driving circuit region 410, peripheral circuits or driving circuits for driving the memory cells of the first memory cell layer MCL1 and the second memory cell layer MCL2 may be arranged. For example, the peripheral circuits arranged in the driving circuit region 410 may process data input to and output from the first memory cell layer MCL1 and the second memory cell layer MCL2 at a high speed. For example, the peripheral circuits may be a page buffer, a latch circuit, a cache circuit, a column decoder, a sense amplifier, a data in/out circuit, and/or a row decoder.

An active region AC for a driving circuit may be defined by an isolation layer 104 on the substrate 101. A plurality of transistors TR that configure the driving circuit region 410 may be formed on the active region AC of the substrate 101. Each of the plurality of transistors TR may include a gate G, a gate insulating layer GD, and a source/drain region SD. A side wall of the gate G may be covered with an insulating spacer 106 and an etch stop layer 108 may be formed on the gate G and the insulating spacer 106. The etch stop layer 108 may include a silicon nitride and/or a silicon oxynitride.

A plurality of interlayer insulating layers 412A, 412B, and 412C may be sequentially stacked on the etch stop layer 108. The plurality of interlayer insulating layers 412A, 412B, and 412C may include a silicon oxide and/or a silicon oxynitride.

The driving circuit region 410 may include a multilayer wiring structure 414 electrically connected to the plurality of transistors TR. The multilayer wiring structure 414 may be mutually insulated by the plurality of interlayer insulating layers 412A, 412B, and 412C.

The multilayer wiring structure 414 may include a first contact 416A, a first wiring layer 418A, a second contact 416B, and a second wiring layer 418B that are sequentially stacked on the substrate 101 and are electrically connected to each other. In some embodiments, the first wiring layer 418A and the second wiring layer 418B may be formed of a metal, a conductive metal nitride, metal silicide, or a combination of the above materials.

In FIG. 13, it is illustrated that the multilayer wiring structure 414 has a wiring structure of two layers including the first wiring layer 418A and the second wiring layer 418B. However, the inventive concepts are not limited thereto. For example, in accordance with a layout of the driving circuit region 410 and a kind and arrangement of the gate G, the multilayer wiring structure 414 may have a structure of three or more layers.

The interlayer insulating layer 105 may be formed on the plurality of interlayer insulating layers 412A, 412B, and 412C. The first memory cell layer MCL1 and the second memory cell layer MCL2 may be arranged on the interlayer insulating layer 105. Although not shown, a wiring structure (not shown) connected among the first memory cell layer MCL1 and the second memory cell layer MCL2 and the driving circuit region 410 may be arranged through the interlayer insulating layer 105. In the variable resistance memory device 400, since the first memory cell layer MCL1 and the second memory cell layer MCL2 are arranged on the driving circuit region 410, a degree of integration of the variable resistance memory device 400 may increase.

In some embodiments, the second insulating layer 160b including the air gaps AG may be arranged between the first memory cells 140-1. The second insulating layer 160b may include the air gaps AG that surround (e.g., are on all side surfaces of) the first memory cells 140-1 while intersecting each other in the first direction X and the second direction Y. That is, the first memory cells 140-1 may share the air gaps AG with other first memory cells 140-1 that are adjacent in the first direction X and the second direction Y.

In addition, the fourth insulating layer 160d including the air gaps AG may be arranged between the second memory cells 140-2. The fourth insulating layer 160d may include the air gaps AG that surround the second memory cells 140-2 while intersecting each other in the first direction X and the second direction Y. That is, the second memory cells 140-2 may share the air gaps AG with other second memory cells 140-2 that are adjacent in the first direction X and the second direction Y.

Figure 14A:
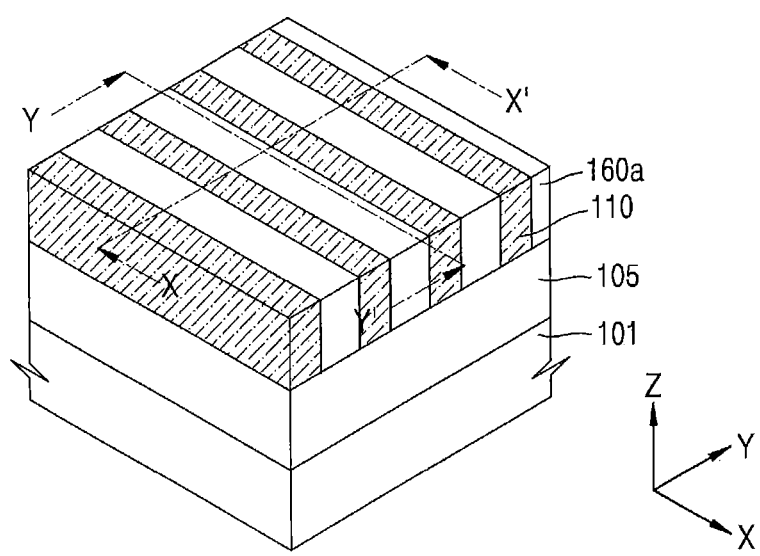
FIGS. 14A, 15A, . . . , and 18A are perspective views illustrating processes of manufacturing a variable resistance memory device according to an embodiment of the inventive concepts.
Figure 14B:
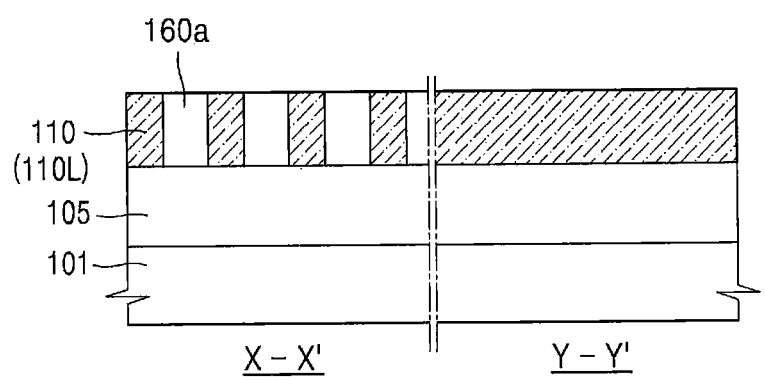
FIGS. 14B, 15B, . . . , and 18B are cross-sectional views taken along lines X-X' and Y-Y' of 14A, 15A, . . . , and 18A.
Figure 15A:
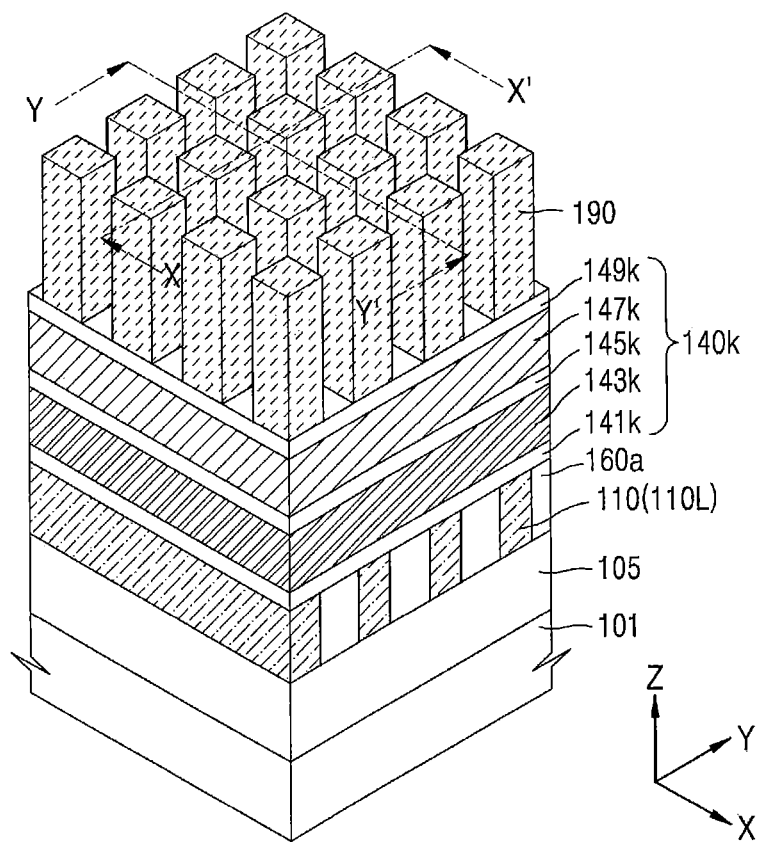
Figure 15B:
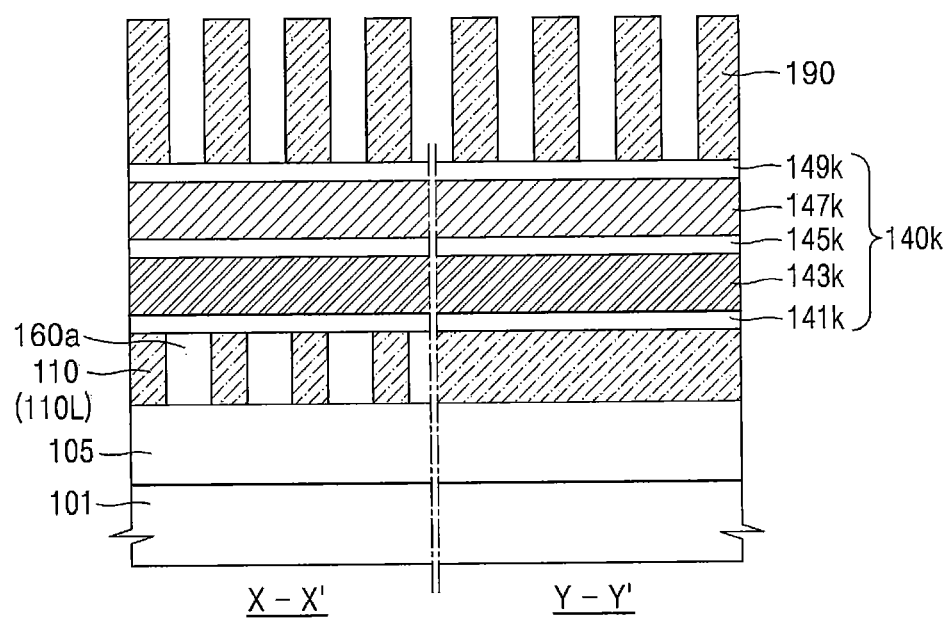

FIGS. 14A, 15A, . . . , and 18A are perspective views illustrating processes of manufacturing a variable resistance memory device according to an embodiment of the inventive concepts. FIGS. 14B, 15B, . . . , and 18B are cross-sectional views taken along the lines X-X' and Y-Y' of 14A, 15A, . . . , and 18A.

Referring to FIGS. 14A and 14B, the interlayer insulating layer 105 may be formed on the substrate 101. The interlayer insulating layer 105 may be formed of, for example, a silicon oxide and/or a silicon nitride, however the interlayer insulating layer 105 is not limited thereto. The first electrode line layer 110L including the plurality of first electrode lines 110 extending in the first direction X and spaced apart from each other may be formed on the interlayer insulating layer 105. The first electrode lines 110 may be formed of a dry etching process or a damascene process. The material of the first electrode lines 110 may be as described above. A first insulating layer 160a extending in the first direction X may be arranged between the first electrode lines 110.

Referring to FIGS. 15A and 15B, a stacking structure 140k may be formed by sequentially stacking a lower electrode material layer 141k, a selection device material layer 143k, an intermediate electrode material layer 145k, a variable resistance material layer 147k, and an upper electrode material layer 149k on the first electrode line layer 110L and the first insulating layer 160a.

Then, a mask pattern 190 including island (e.g., pillar) forms spaced apart from each other in the first direction X and the second direction Y may be formed on the upper electrode material layer 149k. The mask pattern 190 may be formed as a hard mask of a material having etching selectivity with the stacking structure 140k.

Figure 16A:
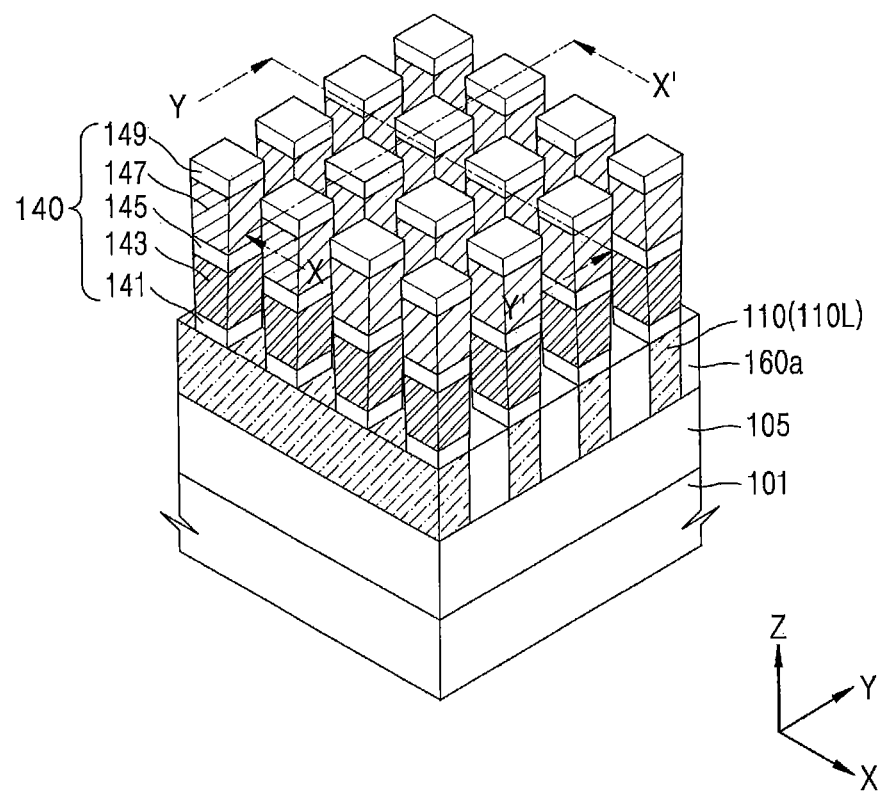
Figure 16B:
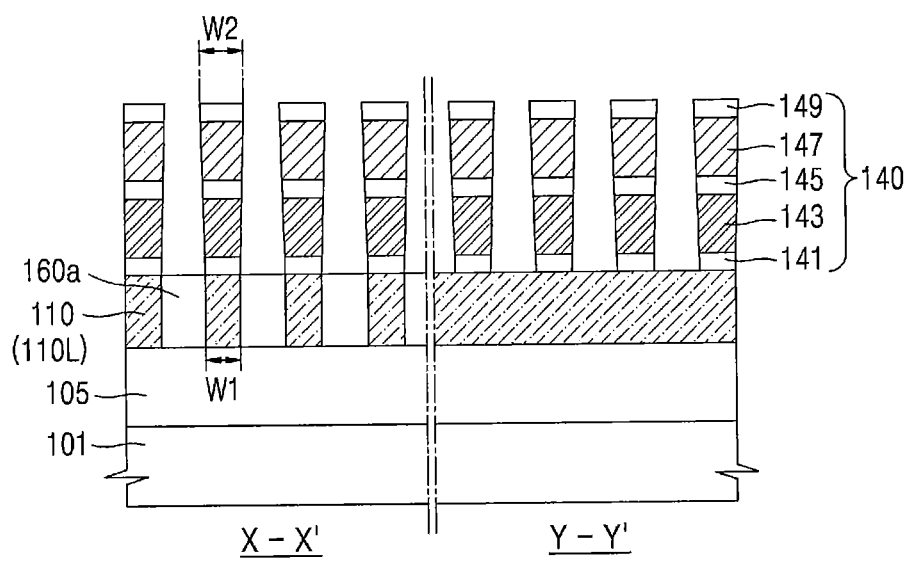

Referring to FIGS. 16A and 16B, the plurality of memory cells 140 may be formed by etching the stacking structure 140k so that parts of upper surfaces of the first electrode line layer 110L and the first insulating layer 160a are exposed by using the mask pattern 190 (refer to FIG. 15A).

The memory cells 140 may be spaced apart from each other in the first direction X and the second direction Y in accordance with a structure of the mask pattern 190 (refer to FIG. 15A) and may be electrically connected to the first electrode lines 110 under the memory cells 140. Each of the memory cells 140 may include the lower electrode layer 141, the selection device layer 143, the intermediate electrode layer 145, the variable resistance layer 147, and the upper electrode layer 149. The mask pattern 190 (refer to FIG. 15A) left after forming the memory cells 140 may be removed.

The memory cells 140 may be formed by a dry etching process, but the inventive concepts are not limited thereto. In accordance with processes of forming the memory cells 140, each of the memory cells 140 may have a structure in which the width W2 (e.g., in a direction substantially parallel to a major surface the substrate 101) of the upper portion is larger than the width W1 of the lower portion. A difference in width between the upper portion and the lower portion may be reduced by etching the stacking structure 140k (refer to FIG. 15A) so that a side surface of the stacking structure 140k is almost vertical by precisely controlling the processes of forming the memory cells 140.

Figure 17A:
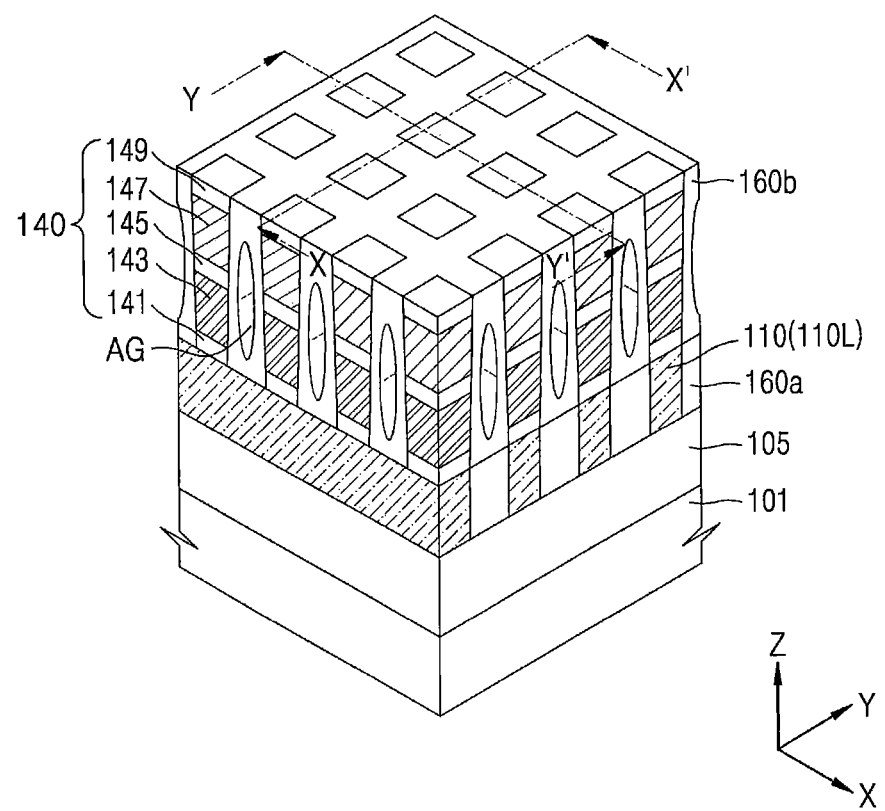
Figure 17B:
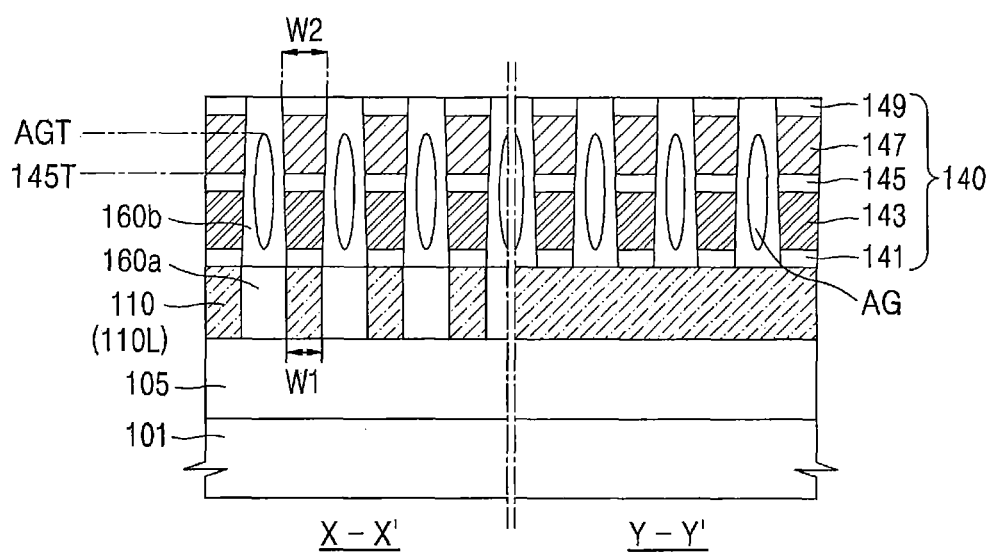

Referring to FIGS. 17A and 17B, the second insulating layer 160b may be formed within spaces among the memory cells 140. The second insulating layer 160b may be formed of the same material as, or a different material from, the first insulating layer 160a. The second insulating layer 160b may be formed by forming an insulating material layer within the spaces among the memory cells 140 to a sufficient thickness so as to include the air gaps AG, and exposing an upper surface of the upper electrode layer 149 by performing planarization through a CMP process.

The second insulating layer 160b may be a material layer formed by a process with poor step coverage. The air gaps AG may refer to portions in which the second insulating layer 160b does not fill the spaces among the memory cells 140. That is, since the height to width ratio of each of the spaces among the memory cells 140 may be very large, in order to fill the spaces, a process with good step coverage would conventionally be used. However, in the variable resistance memory device 100 according to the inventive concepts, in order to form the air gaps AG, the second insulating layer 160b may be intentionally formed by a process with poor step coverage.

In addition, in the variable resistance memory device 100 according to the inventive concept, each of the memory cells 140 may have a structure in which the width W2 of the upper portion is larger than the width W1 of the lower portion. Therefore, overhangs may be formed on the memory cells 140 in the process of forming the second insulating layer 160b so that the air gaps AG that are portions in which the spaces among the memory cells 140 are not completely filled may be formed to be larger.

As spaces occupied by the air gaps AG are larger, parasitic capacitance and cross-talk among the memory cells 140 may be reduced. In some embodiments, the process of forming the second insulating layer 160b may be performed so that a level of an uppermost surface AGT of each of the air gaps AG is higher than a level of an upper surface 145T of the intermediate electrode layer 145.

Figure 18A:
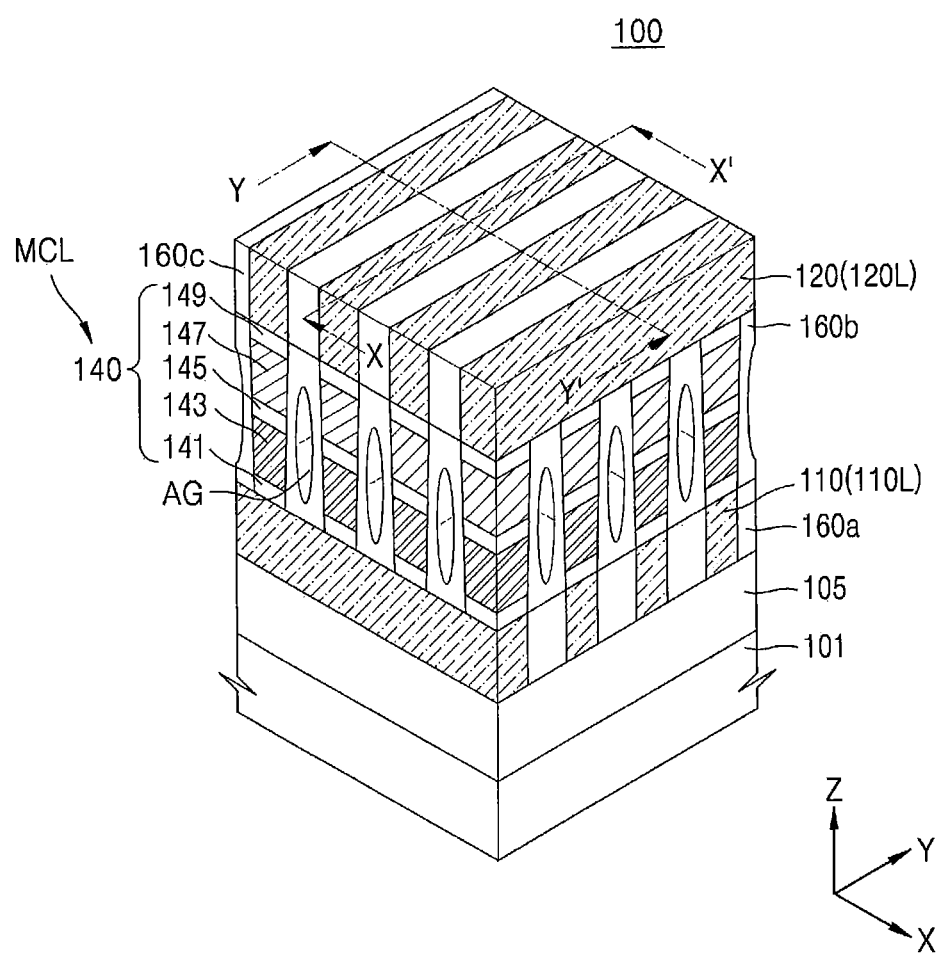
Figure 18B:
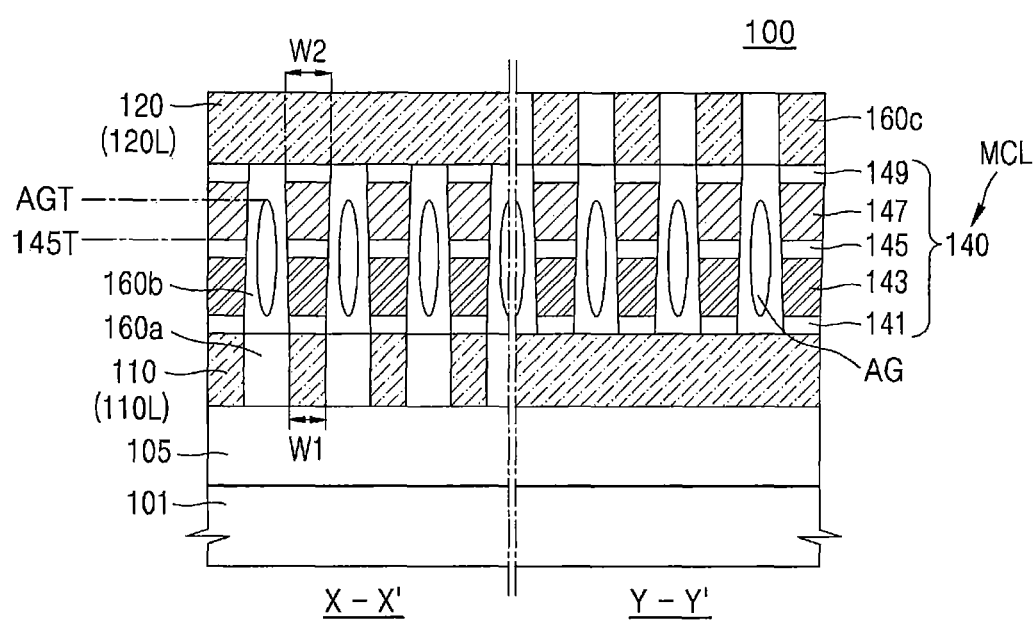

Referring to FIGS. 18A and 18B, the second electrode lines 120 may be formed by forming a conductive layer for a second electrode line layer and patterning the conductive layer through etching. The second electrode lines 120 may extend in the second direction Y and may be spaced apart from each other. A third insulating layer 160c extending in the second direction Y may be arranged between the second electrode lines 120. The second electrode lines 120 may be formed by the dry etching process or the damascene process.

Figure 19:
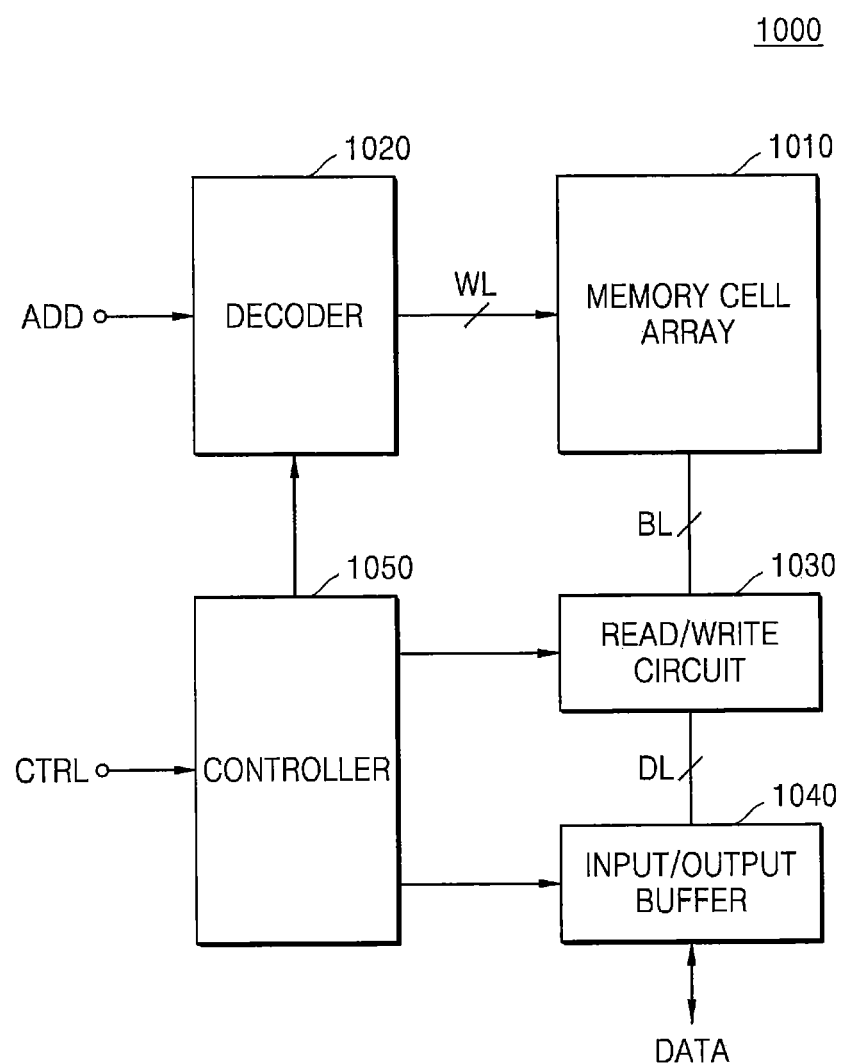
FIG. 19 is a block diagram of a memory system including a variable resistance memory device according to an embodiment of the inventive concepts.

FIG. 19 is a block diagram of a memory system 1000 including a variable resistance memory device according to an embodiment of the inventive concepts.

Referring to FIG. 19, the memory system 1000 may include a memory cell array 1010, a decoder 1020, a read/write circuit 1030, an input/output buffer 1040, and a controller 1050. The memory cell array 1010 may include at least one variable resistance memory device among the variable resistance memory device 100 illustrated in FIGS. 2 to 4, the variable resistance memory devices 100A, 100B, and 100C illustrated in FIGS. 6 to 9, and the variable resistance memory devices 200, 300, and 400 illustrated in FIGS. 10 to 13.

A plurality of memory cells in the memory cell array 1010 may be connected to the decoder 1020 through a word line WL and may be connected to the read/write circuit 1030 through a bit line BL. The decoder 1020 receives an external address ADD and may decode a row address and a column address that are desired to be accessed in the memory cell array 1010 by control of the controller 1050 that operates in accordance with a control signal CTRL.

The read/write circuit 1030 receives data DATA from the input/output buffer 1040 through a data line DL, writes the data DATA in a selected memory cell of the memory cell array 1010 by the control of the controller 1050, or may provide the data DATA read from the selected memory cell of the memory cell array 1010 to the input/output buffer 1040 in accordance with the control of the controller 1050.

It will be understood that although the terms "first," "second," etc. are used herein to describe members, regions, layers, portions, sections, components, and/or elements in example embodiments of the inventive concepts, the members, regions, layers, portions, sections, components, and/or elements should not be limited by these terms. These terms are only used to distinguish one member, region, portion, section, component, or element from another member, region, portion, section, component, or element. Thus, a first member, region, portion, section, component, or element described below may also be referred to as a second member, region, portion, section, component, or element without departing from the scope of the inventive concepts. For example, a first element may also be referred to as a second element, and similarly, a second element may also be referred to as a first element, without departing from the scope of the inventive concepts.

The terminology used herein is for the purpose of describing particular embodiments only and is not intended to be limiting of example embodiments. As used herein, the singular forms "a," "an," and "the" are intended to include the plural forms as well, unless the context clearly indicates otherwise. It will be further understood that the terms "comprises," "comprising," "includes," and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by those of ordinary skill in the art to which the inventive concepts pertain. It will also be understood that terms, such as those defined in commonly used dictionaries, should be interpreted as having a meaning that is consistent with their meaning in the context of this specification and the relevant art and will not be interpreted in an idealized or overly formal sense unless expressly so defined herein.

As used herein, the term "and/or" includes any and all combinations of one or more of the associated listed items. Expressions such as "at least one of," when preceding a list of elements, modify the entire list of elements and do not modify the individual elements of the list.

When a certain example embodiment may be implemented differently, a specific process order may be performed differently from the described order. For example, two consecutively described processes may be performed substantially at the same time or performed in an order opposite to the described order.

In the accompanying drawings, variations from the illustrated shapes as a result, for example, of manufacturing techniques and/or tolerances, are to be expected. Thus, the example embodiments of the inventive concepts should not be construed as being limited to the particular shapes of regions illustrated herein but may be construed to include deviations in shapes that result, for example, from a manufacturing process. For example, an etched region illustrated as a rectangular shape may be a rounded or certain curvature shape. Thus, the regions illustrated in the figures are schematic in nature, and the shapes of the regions illustrated in the figures are intended to illustrate particular shapes of regions of devices and not intended to limit the scope of the present inventive concepts.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on").

Like numbers refer to like elements throughout. Thus, the same or similar numbers may be described with reference to other drawings even if they are neither mentioned nor described in the corresponding drawing. Also, elements that are not denoted by reference numbers may be described with reference to other drawings.

While the inventive concepts have been particularly shown and described with reference to embodiments thereof, it will be understood that various changes in form and details may be made therein without departing from the spirit and scope of the following claims.

What is claimed is:

1. A variable resistance memory device comprising:
   a first electrode line layer comprising first electrode lines extending in a first direction and spaced apart from each other on a substrate;
   a second electrode line layer that is above the first electrode line layer and comprising second electrode lines extending in a second direction orthogonal to the first direction and spaced apart from each other; and
   a memory cell layer comprising memory cells between the first electrode line layer and the second electrode line layer in locations in which the first electrode lines and the second electrode lines overlap each other,
   wherein each of the memory cells comprises a selection device layer, an intermediate electrode layer, and a variable resistance layer,
   wherein a first insulating layer is between the first electrode lines, a second insulating layer is between the memory cells, and a third insulating layer is between the second electrode lines,
   wherein the second insulating layer comprises air gaps on side surfaces of the memory cells, the air gaps intersecting each other in the first direction and the second direction,
   wherein a protective layer is on the side surfaces of the memory cells,
   wherein each of the air gaps is respectively arranged in a space formed by the protective layer, and
   wherein the protective layer is between at least one of the air gaps and the first electrode line layer in a third direction perpendicular to the first direction and the second direction.

2. The variable resistance memory device of claim 1, wherein each of the memory cells has a trapezoidal shaped profile such that a second width of a second portion of the memory cell adjacent the second electrode line layer is larger than a first width of a first portion of the memory cell adjacent the first electrode line layer.

3. The variable resistance memory device of claim 1, wherein the air gaps surround, on a horizontal plane, the memory cells.

4. The variable resistance memory device of claim 1, wherein the memory cells share the air gaps with other memory cells that are adjacent in the first direction and the second direction.

5. The variable resistance memory device of claim 1, wherein the selection device layer comprises an ovonic threshold switching material.

6. The variable resistance memory device of claim 5, wherein a level of an uppermost surface of each of the air gaps is higher than a level of an upper surface of the intermediate electrode layer.

7. The variable resistance memory device of claim 1,
wherein each of the memory cells comprises a heating electrode layer between the intermediate electrode layer and the variable resistance layer, and
wherein the heating electrode layer comprises a carbon (C) based conductive material.

8. The variable resistance memory device of claim 7, wherein a level of an uppermost surface of each of the air gaps is higher than a level of an upper surface of the heating electrode layer.

9. The variable resistance memory device of claim 1, wherein the protective layer comprises a same material as the second insulating layer.

10. A variable resistance memory device comprising:
a first electrode line layer;
a second electrode line layer above the first electrode line layer;
a first memory cell layer between the first electrode line layer and the second electrode line layer and comprising first memory cells; and
an insulating layer comprising first air gaps that are on all side surfaces of the first memory cells,
wherein each of the first memory cells comprises a selection device layer, an intermediate electrode layer, and a variable resistance layer,
wherein a first protective layer is on the side surfaces of the first memory cells,
wherein each of the first air gaps is respectively arranged in a space formed by the first protective layer, and
wherein the first protective layer is between at least one of the first air gaps and the first electrode line layer.

11. The variable resistance memory device of claim 10, wherein the variable resistance memory device comprises:
a third electrode line layer above the second electrode line layer; and
a second memory cell layer between the second electrode line layer and the third electrode line layer and comprising second memory cells,
wherein each of the first memory cells and the second memory cells has a side surface inclination that becomes larger toward an upper portion thereof.

12. The variable resistance memory device of claim 11, further comprising a second insulating layer comprising second air gaps that are on all side surfaces of the second memory cells.

13. The variable resistance memory device of claim 12, wherein the first air gaps have, on a horizontal plane, a first interconnected structure and the second air gaps have, on the horizontal plane, a second interconnected structure.

14. The variable resistance memory device of claim 10,
wherein the first electrode line layer is a word line and the second electrode line layer is a bit line, or
wherein the first electrode line layer is a bit line and the second electrode line layer is a word line.

15. A variable resistance memory device comprising:
a first electrode line layer comprising first electrode lines extending in a first direction and spaced apart from each other on a substrate;
a second electrode line layer above the first electrode line layer and comprising second electrode lines extending in a second direction orthogonal to the first direction and spaced apart from each other; and
a memory cell layer comprising memory cells between the first electrode line layer and the second electrode line layer in locations in which the first electrode lines and the second electrode lines overlap each other,
wherein each of the memory cells comprises a selection device layer, an intermediate electrode layer, and a variable resistance layer,
wherein an insulating layer comprising air gaps is arranged among the memory cells,
wherein the memory cells are isolated from each other by the air gaps,
wherein, in the memory cells, a respective second width of each of the memory cells adjacent to the second electrode line layer is larger than a respective first width of each of the memory cells adjacent to the first electrode line layer,
wherein a protective layer is on side surfaces of the memory cells,
wherein each of the air gaps is respectively arranged in a space formed by the protective layer, and
wherein the protective layer is between at least one of the air gaps and the first electrode line layer in a third direction perpendicular to the first direction and the second direction.

16. The variable resistance memory device of claim 15, wherein the selection device layer comprises an ovonic threshold switching device including a chalcogenide material.

17. The variable resistance memory device of claim 15, wherein the variable resistance layer comprises at least one of GeSbTe, InSbTe, and BiSbTe or has a super lattice structure in which GeTe and SbTe are repeatedly stacked.

18. The variable resistance memory device of claim 15, wherein a level of an uppermost surface of each of the air gaps is higher than a level of an upper surface of the intermediate electrode layer.

19. The variable resistance memory device of claim 15, further comprising a driving circuit region below the first electrode line layer that comprises peripheral circuits and/or driving circuits that are configured to drive the memory cells.

* * * * *